United States Patent
Pedroza et al.

(10) Patent No.: US 11,694,435 B2
(45) Date of Patent: Jul. 4, 2023

(54) SYSTEMS AND METHODS FOR TEMPORARILY DISABLING USER CONTROL INTERFACES DURING ATTACHMENT OF AN ELECTRONIC DEVICE

(71) Applicant: Magic Leap, Inc., Plantation, FL (US)

(72) Inventors: Carlos Julio Suate Pedroza, Miramar, FL (US); Todd Daniel Hendry, Parkland, FL (US); Guillermo Padin Rohena, Coral Springs, FL (US); Paul M. Greco, Parkland, FL (US); Vinosh Christopher Diptee, Boynton Beach, FL (US); Evan Francis Rynk, Boca Raton, FL (US)

(73) Assignee: MAGIC LEAP, INC., Plantation, FL (US)

( * ) Notice: Subject to any disclaimer, the term of this patent is extended or adjusted under 35 U.S.C. 154(b) by 0 days.

(21) Appl. No.: 16/973,004

(22) PCT Filed: Jun. 18, 2019

(86) PCT No.: PCT/US2019/037676
§ 371 (c)(1),
(2) Date: Dec. 7, 2020

(87) PCT Pub. No.: WO2019/246058
PCT Pub. Date: Dec. 26, 2019

(65) Prior Publication Data
US 2021/0256259 A1    Aug. 19, 2021

Related U.S. Application Data

(60) Provisional application No. 62/686,561, filed on Jun. 18, 2018.

(51) Int. Cl.
*G06V 20/20* (2022.01)
*G06F 1/16* (2006.01)
(Continued)

(52) U.S. Cl.
CPC .......... *G06V 20/20* (2022.01); *G01R 33/072* (2013.01); *G02B 27/0172* (2013.01); *G06F 1/163* (2013.01); *G02B 2027/0178* (2013.01)

(58) Field of Classification Search
CPC .... G06K 9/00671; G01R 33/072; G06F 1/163
See application file for complete search history.

(56) References Cited

U.S. PATENT DOCUMENTS 6,850,221 B1    2/2005 Tickle
2005/0237230 A1    10/2005 Bejean
(Continued)

FOREIGN PATENT DOCUMENTS

WO    WO 2019/246058    12/2019

OTHER PUBLICATIONS

International Search Report and Written Opinion for PCT Application No. PCT/US2019/037676, dated Oct. 17, 2019.
(Continued)

*Primary Examiner* — Grace Q Li
(74) *Attorney, Agent, or Firm* — Klintworth & Rozenblat IP LLP

(57) ABSTRACT

Systems and methods of disabling user control interfaces during attachment of a wearable electronic device to a portion of a user's clothing or accessory are disclosed. The wearable electronic device can include inertial measurement units (IMUs), optical sources, optical sensors or electromagnetic sensors. Based on the information provided by the IMUs, optical sources, optical sensors or electromagnetic sensors, an electrical processing and control system can make a determination that the electronic device is being
(Continued)

grasped and picked up for attaching to a portion of a user's clothing or accessory or that the electronic device is in the process of being attached to a portion of a user's clothing or accessory and temporarily disable one or more user control interfaces disposed on the outside of the wearable electronic device.

20 Claims, 17 Drawing Sheets

(51) Int. Cl.
*G01R 33/07* (2006.01)
*G02B 27/01* (2006.01)

(56) References Cited

U.S. PATENT DOCUMENTS

| | | |
|---|---|---|
| 2006/0028436 A1 | 2/2006 | Armstrong |
| 2007/0081123 A1 | 4/2007 | Lewis |
| 2008/0125288 A1* | 5/2008 | Case ............... G06F 17/40 |
| | | 482/1 |
| 2012/0127062 A1 | 5/2012 | Bar-Zeev et al. |
| 2012/0162549 A1 | 6/2012 | Gao et al. |
| 2013/0082922 A1 | 4/2013 | Miller |
| 2013/0100601 A1* | 4/2013 | Griffin ............... G06F 1/1616 |
| | | 361/679.27 |
| 2013/0117377 A1 | 5/2013 | Miller |
| 2013/0119255 A1 | 5/2013 | Dickinson et al. |
| 2013/0125027 A1 | 5/2013 | Abovitz |
| 2013/0208234 A1 | 8/2013 | Lewis |
| 2013/0242262 A1 | 9/2013 | Lewis |
| 2014/0071539 A1 | 3/2014 | Gao |
| 2014/0145914 A1 | 5/2014 | Latta et al. |
| 2014/0177023 A1 | 6/2014 | Gao et al. |
| 2014/0218468 A1 | 8/2014 | Gao et al. |
| 2014/0256303 A1 | 9/2014 | Jones |
| 2014/0267420 A1 | 9/2014 | Schowengerdt |
| 2015/0016777 A1 | 1/2015 | Abovitz et al. |
| 2015/0084857 A1* | 3/2015 | Kimura ............... G06F 1/163 |
| | | 345/156 |
| 2015/0103306 A1 | 4/2015 | Kaji et al. |
| 2015/0178939 A1 | 6/2015 | Bradski et al. |
| 2015/0190052 A1 | 7/2015 | Vaitaitis |
| 2015/0205126 A1 | 7/2015 | Schowengerdt |
| 2015/0309263 A2 | 10/2015 | Abovitz et al. |
| 2015/0326570 A1 | 11/2015 | Publicover et al. |
| 2015/0346495 A1 | 12/2015 | Welch et al. |
| 2016/0011419 A1 | 1/2016 | Gao |
| 2016/0026253 A1 | 1/2016 | Bradski et al. |
| 2016/0072540 A1 | 3/2016 | Davis et al. |
| 2016/0249864 A1 | 9/2016 | Kang et al. |
| 2018/0053284 A1 | 2/2018 | Rodriguez et al. |
| 2018/0196934 A1* | 7/2018 | Lothgren ............... H04W 4/90 |
| 2018/0206062 A1* | 7/2018 | Jain ............... H04W 4/02 |
| 2019/0243472 A1* | 8/2019 | Stafford ............... G02B 27/017 |
| 2019/0365285 A1* | 12/2019 | Kashimoto ............ A61B 5/6838 |

OTHER PUBLICATIONS

International Preliminary Report on Patentability for PCT Application No. PCT/US2019/037676, dated Dec. 22, 2020.
ARToolKit: https://web.archive.org/web/20051013062315/http://www.hitl.washington.edu:80/artoolkit/documentation/hardware.htm, archived Oct. 13, 2005.
Azuma, "A Survey of Augmented Reality," Teleoperators and Virtual Environments 6, 4 (Aug. 1997), pp. 355-385. https://web.archive.org/web/20010604100006/http://www.cs.unc.edu/~azuma/ARpresence.pdf.
Azuma, "Predictive Tracking for Augmented Realty," TR95-007, Department of Computer Science, UNC-Chapel Hill, NC, Feb. 1995.
Bimber, et al., "Spatial Augmented Reality—Merging Real and Virtual Worlds," 2005 https://web.media.mit.edu/~raskar/book/BimberRaskarAugmentedRealityBook.pdf.
Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).
Tanriverdi and Jacob, "interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

* cited by examiner

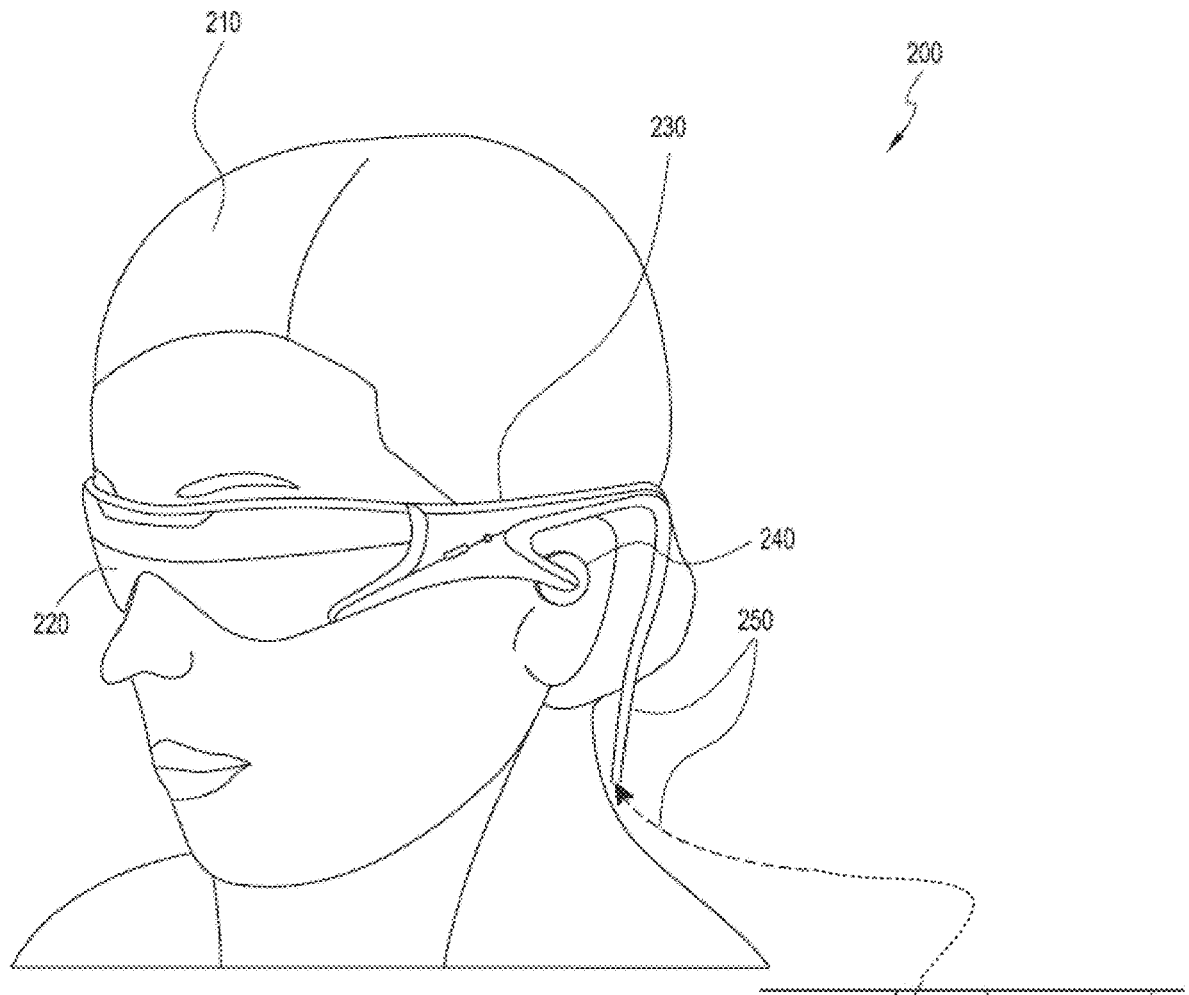
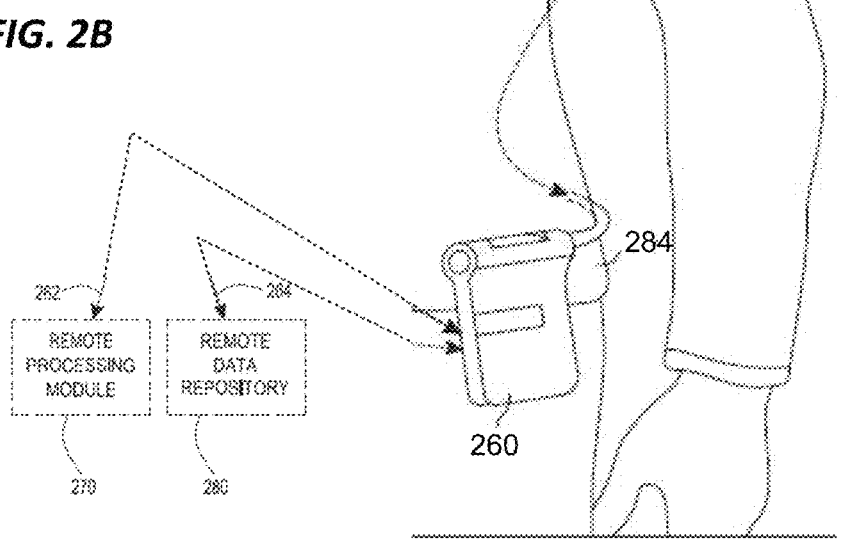
FIG. 2B

SYSTEMS AND METHODS FOR TEMPORARILY DISABLING USER CONTROL INTERFACES DURING ATTACHMENT OF AN ELECTRONIC DEVICE

PRIORITY CLAIM

This application claims the priority benefit of U.S. Provisional Patent Application No. 62/686,561 filed on Jun. 18, 2018, which is incorporated by reference herein in its entirety. This application also relates to U.S. application Ser. No. 14/555,585 filed on Nov. 27, 2014, published on Jul. 23, 2015 as U.S. Publication No. 2015/0205126; U.S. application Ser. No. 14/690,401 filed on Apr. 18, 2015, published on Oct. 22, 2015 as U.S. Publication No. 2015/0302652; U.S. application Ser. No. 14/212,961 filed on Mar. 14, 2014, now U.S. Pat. No. 9,417,452 issued on Aug. 16, 2016; and U.S. application Ser. No. 14/331,218 filed on Jul. 14, 2014, published on Oct. 29, 2015 as U.S. Publication No. 2015/0309263, the disclosures of each which are hereby incorporated by reference herein in their entireties.

FIELD

The present disclosure relates to virtual reality and augmented reality imaging and visualization systems and more particularly to temporarily disabling user control interfaces on wearable portions of the virtual reality and augmented reality imaging and visualization systems when the wearable portion are in the process of being attached to a portion of a user's clothing or accessory.

BACKGROUND

Modern computing and display technologies have facilitated the development of systems for so called "virtual reality", "augmented reality", or "mixed reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user; a mixed reality, or "MR", related to merging real and virtual worlds to produce new environments where physical and virtual objects co-exist and interact in real time. As it turns out, the human visual perception system is very complex, and producing a VR, AR, or MR technology that facilitates a comfortable, natural-feeling, rich presentation of virtual image elements amongst other virtual or real-world imagery elements is challenging. Systems and methods disclosed herein address various challenges related to VR, AR and MR technology.

SUMMARY

Various examples described herein are directed towards temporarily disabling one or more user control interfaces disposed on a housing of an electronic device that is associated with the examples of various AR/VR devices described herein. The electronic device can be configured as a wearable electronic device that can be attached to a portion of a user's clothing, a portion of a user's accessory (e.g., belt) and/or a portion of a lanyard disposed around a user's neck, arm, shoulder, wrist, etc. The electronic device can be configured to provide electrical power to various components of the AR/VR devices described herein. The electronic device can further comprise an electronic control system in electrical communication with one or more sensors and/or one or more inertial measurement units and detect that the electronic device has been picked up for attaching and/or is in the process of being attached to a portion of a user's clothing, a portion of a user's accessory (e.g., belt) and/or a portion of a lanyard disposed around a user's neck, arm, shoulder, wrist, etc. In response to detecting that the electronic device has been picked up for attaching and/or is in the process of being attached to a portion of a user's clothing, a portion of a user's accessory (e.g., belt) and/or a portion of a lanyard disposed around a user's neck, arm, shoulder, wrist, etc., the electronic control system can disable one or more user control interfaces disposed on the electronic device to prevent accidental activation of the user control interfaces.

The systems, methods and devices of this disclosure each have several innovative aspects, no single one of which is solely responsible for the desirable attributes disclosed herein. A variety of example systems and methods are provided below.

Example 1: A head-mounted display system configured to project light to an eye of a user to display augmented reality image content in a vision field of said user, said head-mounted display system comprising:
a frame configured to be supported on a head of a user;
a display device coupled to the frame, said display configured to project light into said user's eye to display augmented reality image content to the user's vision field; and
an electronic device configured to be attached to a portion of the user's clothing or accessory, the electronic device being remote from the frame, the electronic device comprising:
a housing;
one or more user control interfaces disposed on the housing, the one or more user control interfaces configured to control a parameter of the head-mounted display system;
and an electronic control system configured to either or both (i) detect that the electronic device is grasped and picked up by the user for attaching to a portion of the user's clothing or accessory or (ii) detect that the electronic device is in the process of being attached to a portion of the user's clothing or accessory, wherein the electronic control system is configured to temporarily disable the one or more user control interfaces in response to either or both (i) and (iii).

Example 2: The head mounted display system of Example 1, wherein the electronic device further comprises an electrical power supply system.

Example 3: The head mounted display system of any of Examples 1-2, wherein the electrical power supply system comprises a battery pack.

Example 4: The head mounted display system of any of Examples 1-3, wherein the one or more user control interfaces comprise a touch surface, a button, a knob or a switch.

Example 5: The head mounted display system of any of Examples 1-4, wherein the parameter comprises at least one of volume, brightness, contrast or color.

Example 6: The head mounted display system of any of Examples 1-5, further comprising a speaker coupled to the frame and positioned near the user's ear.

Example 7: The head mounted display system of any of Examples 1-6, wherein the electronic device further comprises an electronic processor disposed in the housing.

Example 8: The head-mounted display system of any of Examples 1-7, wherein the housing comprises a first portion and a second portion separated from the first portion by a first gap.

Example 9: The head-mounted display system of Example 8, wherein the first portion comprises one or more electronic components and the second portion comprises an electrical power supply system.

Example 10: The head-mounted display system of any of Examples 8-9, further comprising a first projection extending from the first portion into the first gap and a second projection extending from the second portion into the first gap, the first projection separated from the second projection by a second gap, wherein the electronic device is configured to be attached to a portion of the user's clothing or accessory by inserting a portion of the user's clothing or accessory through the second gap between the first projection and the second projection.

Example 11: The head-mounted display system of any of Examples 8-10, wherein the housing further comprises a connecting region joining the first portion and the second portion.

Example 12: The head-mounted display system of Example 11, further comprising a strain gauge disposed in or near the connecting region, the strain gauge configured to detect a change in strain of the connecting region caused by a change in a size of the first gap, wherein the electronic control system is configured to temporarily disable the one or more user control interfaces in response to the strain gauge detecting a strain in the connecting region.

Example 13: The head-mounted display system of any of Examples 8-12, further comprising a proximity sensor disposed in the first gap, the proximity sensor configured to detect presence of an object in the first gap.

Example 14: The head-mounted display system of Example 13, wherein the proximity sensor comprises an infrared (IR) light emitter configured to emit IR light and an IR sensor configured to detect IR light reflected from the object in the first gap.

Example 15: The head-mounted display system of any of Examples 13-14, wherein the electronic control system is configured to temporarily disable the one or more user control interfaces in response to the proximity sensor detecting presence of the object in the first gap.

Example 16: The head-mounted display system of any of Examples 8-15, further comprising a magnetic sensor disposed in the first or second portion and a magnet disposed in the second or first portion.

Example 17: The head-mounted display system of Example 16, wherein the electronic control system is configured to temporarily disable the one or more user control interfaces in response to the magnetic sensor detecting a change in magnetic field strength caused by a changed in size of the second gap as the electronic device is in the process of being attached to a portion of the user's clothing or accessory.

Example 18: The head-mounted display system of any of Example 8-17, further comprising a light sensor disposed in the first gap, the light sensor configured to detect an amount of light in the first gap.

Example 19: The head-mounted display system of Example 18, wherein the electronic control system is configured to temporarily disable the one or more user control interfaces in response to the light sensor detecting that the amount of light in the first gap is below a threshold level.

Example 20: The head-mounted display system of any of Examples 1-19, wherein the one or more user control interfaces comprise a capacitive sensor configured to detect a touch input.

Example 21: The head-mounted display system of any of Examples 1-20, wherein the electronic device further comprises at least one of a strain gauge, a proximity sensor, a light sensor, a magnet or a Hall effect sensor.

Example 22: The head-mounted display system of any of Examples 1-22, further comprising one or more inertial measurement units configured to detect a change in orientation, an acceleration or a movement of the electronic device.

Example 23: The head-mounted display system of Example 22, wherein electronic control system is configured to temporarily disable the one or more user control interfaces in response to the one or more inertial measurement units detecting that the change in the orientation, acceleration or movement of the electronic device indicates that the electronic device is grasped and picked up by the user for attaching to a portion of the user's clothing or accessory.

Example 24: The head-mounted display system of any of Example 22-23, wherein the one or more inertial measurement units comprise a gyroscope or an accelerometer.

Example 25: The head-mounted display system of any of Example 1-24, wherein the electronic device comprises a sensor configured to provide information based on which the electronic control system can determine either (a) that the electronic device has been attached or (b) that the electronic device has almost attached to the portion of the user's clothing or accessory or (c) both (a) and (b), and wherein the electronic control system is configured to activate the one or more user control interfaces.

Example 26: The head mounted display system of any of Examples 1-25, wherein the display device comprises a waveguide.

Example 27: The head mounted display system any of Examples 1-26, wherein the electronic control system is configured to activate the one or more user control interfaces in response to detecting that the electronic device is attached to a portion of the user's clothing or accessory.

Example 28: A method of disabling one or more user control interfaces disposed on a wearable electronic device when the wearable electronic device is grasped and picked up by a user for attaching to a portion of the user's clothing or accessory or is in the process of being attached to a portion of the user's clothing or accessory, the method comprising:

detecting a change in an orientation, acceleration or movement of the wearable electronic device using one or more inertial measurement units disposed in the wearable device;

determining, using an electronic processor, that the detected change in the orientation, acceleration or movement of the wearable electronic device indicates that the wearable electronic device is grasped and picked up by the user for attaching to a portion of the user's clothing or accessory or is in the process of being attached to a portion of the user's clothing or accessory; and temporarily disabling the one or more user control interfaces using an electronic control system in response to determining that the wearable electronic device is grasped and picked up by the user for attaching to a portion of the user's clothing or accessory or is in the process of being attached to a portion of the user's clothing or accessory.

Example 29: The method of Examples 28, wherein the one or more inertial measurement units comprise a gyroscope or an accelerometer.

Example 30: The method of any of Examples 28-29, wherein the wearable electronic device is configured to be in electronic communication with a head mounted display device.

Example 31: The method of any of Examples 28-30, further comprising activating the one or more user control interfaces in response to determining that the wearable electronic device is attached to a portion of the user's clothing or accessory.

Example 32: A method of disabling one or more user control interfaces disposed on a wearable electronic device when the wearable electronic device is grasped and picked up by the user for attaching to a portion of the user's clothing or accessory or is in the process of being attached to a portion of the user's clothing or accessory, the electronic device comprising a housing, the method comprising:

sensing, using a sensor, presence of an object in a gap between a first portion of the housing and a second portion of the housing; and temporarily disabling the one or more user control interfaces using an electronic control system in response to sensing the presence of an object in the gap.

Example 33: The method of Example 32, wherein the sensor comprises a proximity sensor or a light sensor.

Example 34: The method of any of Examples 32-33, further comprising activating the one or more user control interfaces in response to determining that the wearable electronic device is attached to a portion of the user's clothing or accessory.

Example 35: The method of any of Examples 32-34, wherein the wearable electronic device is in electrical communication with a head-mounted display system configured to project light to an eye of a user to display augmented reality image content in a vision field of said user.

Example 36: The method of Example 35, wherein the head-mounted display system comprises a frame configured to be supported on the user's head.

Example 37: The head-mounted display system of any of Examples 8-9, further comprising a first projection extending from the first portion into the first gap, wherein the electronic device is configured to be attached to a portion of the user's clothing or accessory by inserting a portion of the user's clothing or accessory through a gap formed at least in part by said first projection.

Example 38: The head-mounted display system of any of Examples 1-27 and 37, comprising a clip configured to attach the housing to a portion of the user's clothing or accessory.

Example 39: The head-mounted display system of any of Examples 1-27 and 37-38, comprising a strain gauge configured to detect strain, wherein the electronic control system is configured to temporarily disable the one or more user control interfaces in response to the strain gauge detecting strain when the electronic device is in the process of being attached to a portion of the user's clothing or accessory.

Example 40: The head-mounted display system of any of Examples 1-27 and 37-39, comprising a light emitter configured to emit light and a sensor configured to detect light to sense a portion of the user's clothing or accessory when the electronic device is in the process of being attached to a portion of the user's clothing or accessory.

Example 41: The head-mounted display system of any of Examples 1-27 and 37-40, comprising an IR light emitter configured to emit IR light and an IR sensor configured to detect IR light to sense a portion of the user's clothing or accessory.

Example 42: The head-mounted display system of any of Examples 1-27 and 37-39, comprising a light sensor, the electronic control system configured to temporarily disable the one or more user control interfaces in response to a signal from the light sensor.

Example 43: The head-mounted display system of any of Examples 1-27 and 37-42, comprising a magnetic sensor, the electronic control system configured to temporarily disable the one or more user control interfaces in response to the magnetic sensor detecting a change in magnetic field strength caused as the electronic device is in the process of being attached to a portion of the user's clothing or accessory.

Example 44: The head-mounted display system of any of Examples 1-27 and 37-43, wherein the electronic control system is configured to temporarily disable the one or more user control interfaces in response to a signal from one or more inertial measurement units based on an orientation, acceleration or movement of the electronic device that indicates that the electronic device is grasped and picked up by the user for attaching to a portion of the user's clothing or accessory.

Example 45: The head-mounted display system of any of Examples 1-27 and 37-44, further comprising one or more motion sensors configured to detect motion of the electronic device.

Example 46: The head-mounted display system of any of Examples 1-27 and 37-44, further comprising one or more motion sensors configured to detect movement, an acceleration, or a change in orientation of the electronic device.

Example 47: The head-mounted display system of Example 46, wherein electronic control system is configured to temporarily disable the one or more user control interfaces in response to the one or more motion sensors detecting that the movement, acceleration or change in the orientation of the electronic device indicates that the electronic device is grasped and picked up by the user for attaching to a portion of the user's clothing or accessory.

Example 48: The head-mounted display system of any of Example 45-47, wherein the one or more motion sensors comprise an inertial measurement unit, a gyroscope or an accelerometer.

Example 49: The head-mounted display system of any of Examples 1-27 and 37-43, wherein the electronic control system is configured to temporarily disable the one or more user control interfaces in response to a signal from one or more motion sensors based on an orientation, acceleration or movement of the electronic device that indicates that the electronic device is grasped and picked up by the user for attaching to a portion of the user's clothing or accessory.

Example 50: A method of disabling one or more user control interfaces disposed on a wearable electronic device when the wearable electronic device is grasped and picked up by a user for attaching to a portion of the user's clothing or accessory or is in the process of being attached to a portion of the user's clothing or accessory, the method comprising:

detecting movement of the wearable electronic device using one or more motion sensors disposed in the wearable device;

determining, using an electronic processor, that the detected movement of the wearable electronic device indicates that the wearable electronic device is grasped and picked up by the user for attaching to a portion of the user's clothing or accessory or is in the process of being attached to a portion of the user's clothing or accessory; and temporarily disabling the one or more user control interfaces using an electronic control system in response to determining that the wearable electronic device is grasped and picked up by the user for attaching to a portion of the user's clothing or accessory or is in the process of being attached to a portion of the user's clothing or accessory.

Example 51: The method of Examples 50, wherein the one or more motion sensors comprise an inertial measurement unit, a gyroscope or an accelerometer.

Example 52: The method of any of Examples 50-51, wherein the wearable electronic device is configured to be in electronic communication with a head mounted display device.

Example 53: The method of any of Examples 50-52, further comprising activating the one or more user control interfaces in response to determining that the wearable electronic device is attached to a portion of the user's clothing or accessory.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

BRIEF DESCRIPTION OF THE DRAWINGS

FIGS. 2A and 2B schematically illustrates an example of a wearable system.

Figure 1:
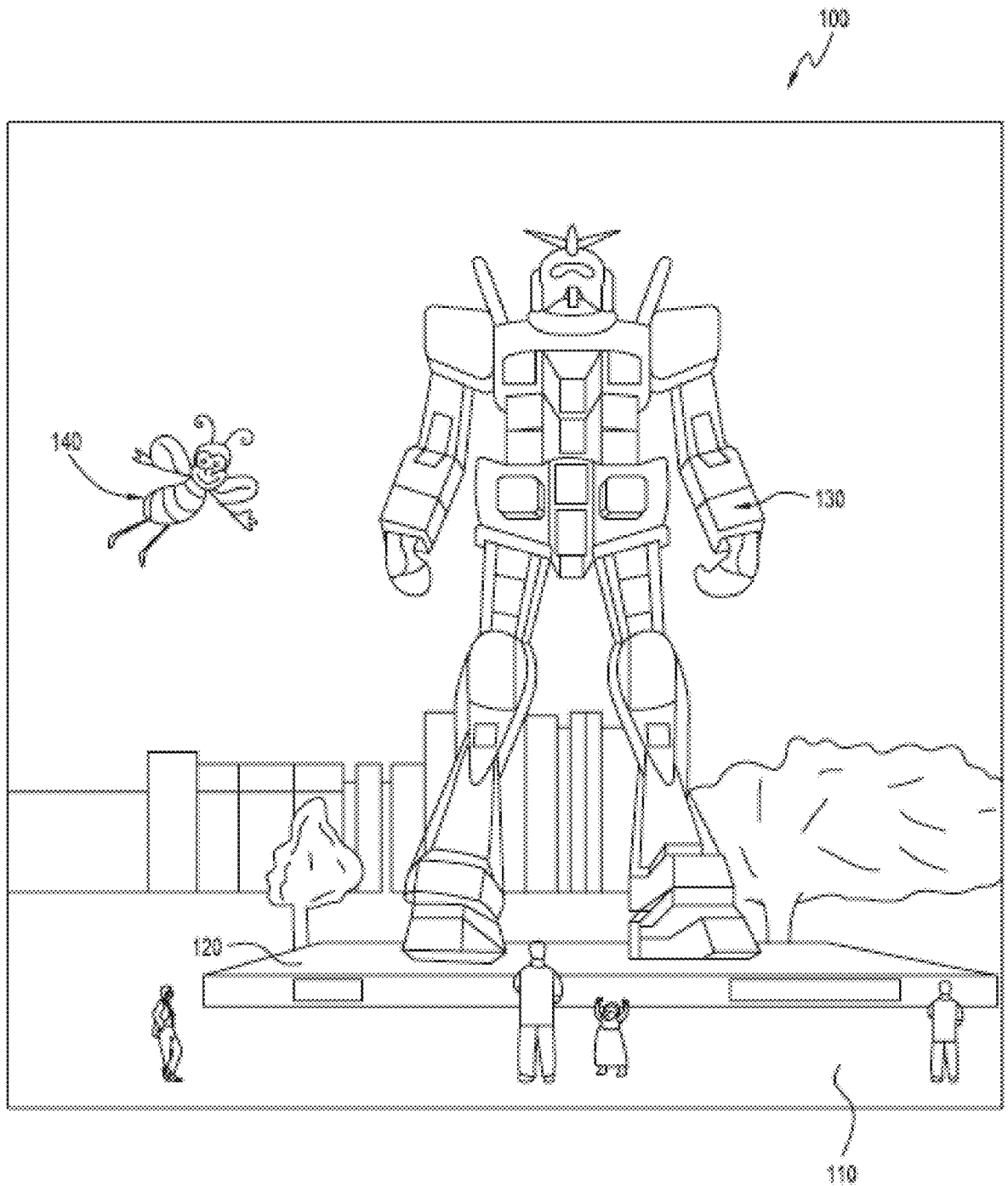
FIG. 1 depicts an illustration of a mixed reality scenario with certain virtual reality objects, and certain physical objects viewed by a person.

Throughout the drawings, reference numbers may be re-used to indicate correspondence between referenced elements. The drawings are provided to illustrate examples described herein and are not intended to limit the scope of the disclosure.

DETAILED DESCRIPTION

Overview

A wearable device for an AR/VR/MR system can be a head-mounted device (HMD) for presenting three-dimensional (3D) images to a user. An HMD may include a head-mounted display which can render a three-dimensional (3D) virtual object into the user's environment from the perspective of the user's eyes. As a result, the 3D virtual object may be perceived by the user in a similar manner as the real world objects. The HMD can render the 3D virtual object based on a world map which indicates the objects (including virtual objects) in the user's environment. The HMD can illuminate pixels on the display with a color and intensity corresponding to the world map. However, a point in the world map may not have a predetermined rendering location on an HMD since the user's eyes move around. Although the display may be calibrated relative to the user's eyes, such as when the device is first used by the user, such calibration may not always be reliable because the display will not be strongly affixed to the user's head. For example, the display can move when the user is interacting with it, such as when a user is playing a video game that requires user movement. Further, the display may slip slightly down the user's nose or tilt relative to a line between the user's ears. As a result, the HMD may not be able to provide a realistic presentation of the virtual object due to the shift (such as tilting forward or to one side) of the display.

The techniques described herein are at least in part directed to solving this problem. The inward-facing imaging system of the wearable device can acquire images of the periocular region of the user's face. The wearable device can analyze the periocular images to identify periocular features (e.g., position of the user's eyes). The wearable device can track the periocular features to determine the relative position between the user's eyes and the HMD. Based on this information, the wearable device can dynamically adjust the rendering location of a virtual object (to be displayed by the HMD) to reflect the perspectives of the user's eyes. Accordingly, such examples of the HMD can accurately display images to the user even when the HMD slips, moves, or tilts slightly relative to the user's head.

The relative position between the HMD and the user's head can also be used to determine a fit of HMD. The fit may provide an indication on whether to adjust certain parameters of the HMD (e.g., rendering parameters or the position of the frame (e.g., by increasing or decreasing the distances between the left and right ear stems to accommodate a larger or smaller head)) to provide a realistic and immersive visual experience. The HMD can use a mapping from an eye-image space of the periocular region to a fit space for the device to determine goodness of fit. The eye-image space may be determined based on images acquired by the inward-facing imaging system, such as for example, images of periocular regions or features. The fit space can include a collection of qualitative or quantities indications for degrees of fit. The mapping may be learned by a machine learning technique such as, e.g., a deep neural network, to identify features in the user's periocular region and use the identified features to determine relative positions between the HMD and the user's face or to classify goodness of fit. The HMD can provide an indication on whether the HMD fits the user's face based on the relative position or other features learned by the machine learning technique. The HMD can also adjust the projection of light from the 3D display based on the relative position of the HMD with respect to the user's head so that the light (e.g., a light field) is accurately projected into each of the user's eyes.

The HMD can also use the mapping to determine whether the user is wearing the HMD. For example, when the HMD determines that the periocular features do not appear in the images acquired by the inward-facing imaging system (or are too small, indicating the HMD is off the user's face), the HMD may send a signal indicating that the user has taken off the device. The signal may cause the device to change from one mode to another. For example, the signal may cause the HMD to change from an active mode to a powered off mode or a sleep mode. As another example, the HMD can use the images to calculate the distance between the user's face and the device; and if the HMD determines that the distance is greater than a threshold distance, the HMD may send a signal indicating that the user has taken off the HMD.

Examples of 3D Display of a Wearable System

A wearable system (also referred to herein as an augmented reality (AR) system) can be configured to present 2D or 3D virtual images to a user. The images may be still images, frames of a video, or a video, in combination or the like. At least a portion of the wearable system can be implemented on a wearable device that can present a VR, AR, or MR environment, alone or in combination, for user interaction. The wearable device can be a head-mounted device (HMD) which is used interchangeably as an AR device (ARD). Further, for the purpose of the present disclosure, the term "AR" is used interchangeably with the term "MR".

FIG. 1 depicts an illustration of a mixed reality scenario with certain virtual reality objects, and certain physical objects viewed by a person. In FIG. 1, an MR scene 100 is depicted wherein a user of an MR technology sees a real-world park-like setting 110 featuring people, trees, buildings in the background, and a concrete platform 120. In addition to these items, the user of the MR technology also perceives that he "sees" a robot statue 130 standing upon the real-world platform 120, and a cartoon-like avatar character 140 flying by which seems to be a personification of a bumble bee, even though these elements do not exist in the real world.

In order for the 3D display to produce a true sensation of depth, and more specifically, a simulated sensation of surface depth, it may be desirable for each point in the display's visual field to generate an accommodative response corresponding to its virtual depth. If the accommodative response to a display point does not correspond to the virtual depth of that point, as determined by the binocular depth cues of convergence and stereopsis, the human eye may experience an accommodation conflict, resulting in unstable imaging, harmful eye strain, headaches, and, in the absence of accommodation information, almost a complete lack of surface depth.

VR, AR, and MR experiences can be provided by display systems having displays in which images corresponding to a plurality of depth planes are provided to a viewer. The images may be different for each depth plane (e.g., provide slightly different presentations of a scene or object) and may be separately focused by the viewer's eyes, thereby helping to provide the user with depth cues based on the accommodation of the eye required to bring into focus different image features for the scene located on different depth plane or based on observing different image features on different depth planes being out of focus. As discussed elsewhere herein, such depth cues provide credible perceptions of depth.

Figure 2A:
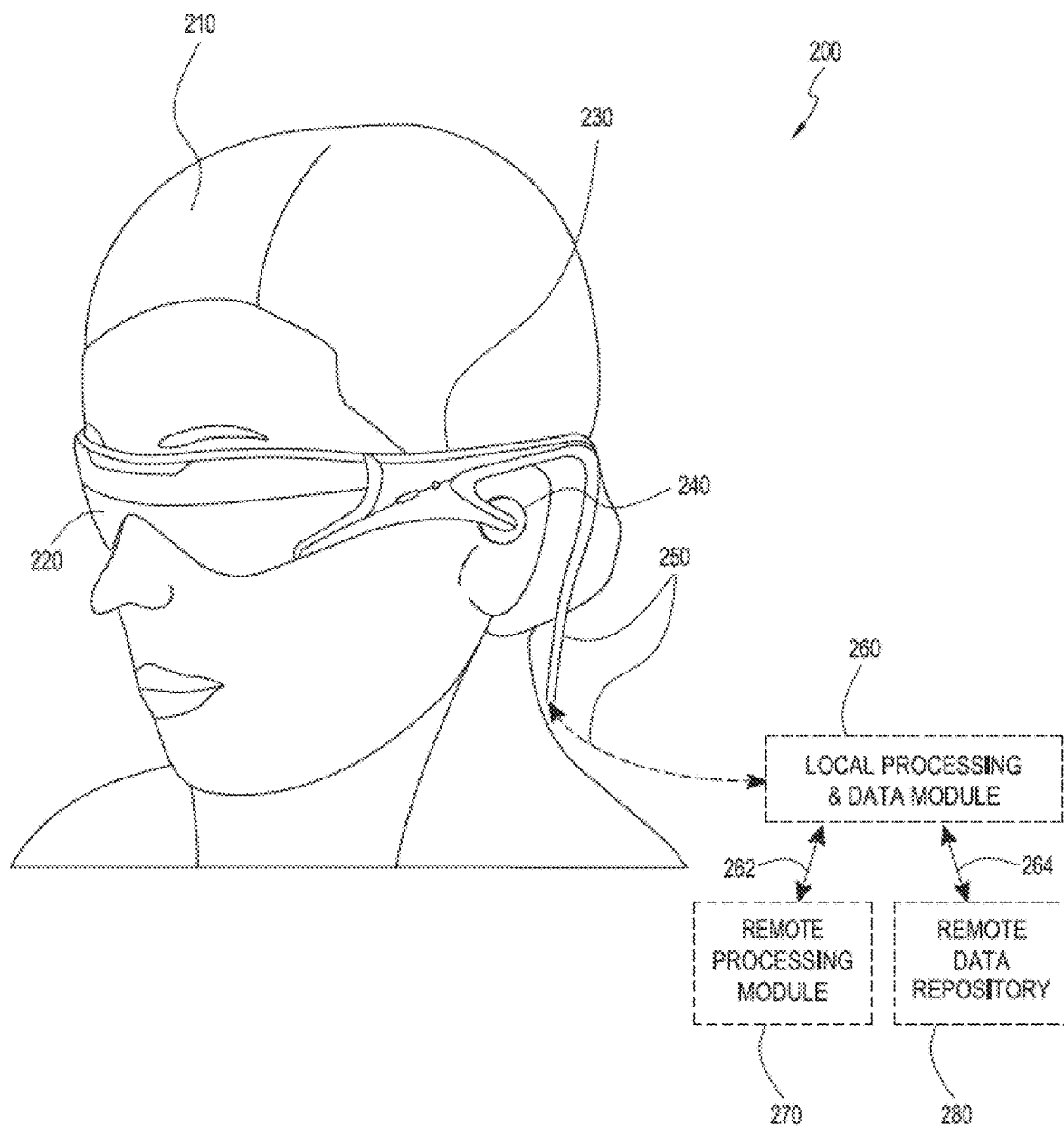

FIGS. 2A and 2B illustrates an example of wearable system 200 which can be configured to provide an AR/VR/MR scene. The wearable system 200 can also be referred to as the AR system 200. The wearable system 200 includes a display 220, and various mechanical and electronic modules and systems to support the functioning of display 220. The display 220 may be coupled to a frame 230, which is wearable by a user, wearer, or viewer 210. The display 220 can be positioned in front of the eyes of the user 210. The display 220 can present AR/VR/MR content to a user. The display 220 can comprise a head mounted display that is worn on the head of the user. The head mounted display may be a heads-up display (HUD) which can display virtual information in pre-determined locations within a field of view of the user (as perceived through the HUD). The head-mounted display may also be a spatial augmented reality (SAR) display which can render 3D objects into the user's environment in a perspective correct manner (e.g., from the perspective of the user) such that the virtual objects appear similar to the real world objects. The perspective used for rendering the virtual objects may also be referred to as rendering viewpoint.

In some examples, a speaker 240 is coupled to the frame 230 and positioned adjacent the ear canal of the user (in some examples, another speaker, not shown, is positioned adjacent the other ear canal of the user to provide for stereo/shapeable sound control). The display 220 can include an audio sensor (e.g., a microphone) 232 for detecting an audio stream from the environment and capture ambient sound. In some examples, one or more other audio sensors, not shown, are positioned to provide stereo sound reception. Stereo sound reception can be used to determine the location of a sound source. The wearable system 200 can perform voice or speech recognition on the audio stream.

The wearable system 200 can include an outward-facing imaging system 464 (shown in FIG. 4) which observes the world in the environment around the user. The wearable system 200 can also include an inward-facing imaging system 462 (shown in FIG. 4) which can track the eye movements of the user. The inward-facing imaging system may track either one eye's movements or both eyes' movements. The inward-facing imaging system 462 may be attached to the frame 230 and may be in electrical communication with the processing modules 260 or 270, which may process image information acquired by the inward-facing imaging system to determine, e.g., the pupil diameters or orientations of the eyes, eye movements or eye pose of the user 210. The inward-facing imaging system 462 may include one or more cameras. For example, at least one camera may be used to image each eye. The images acquired by the cameras may be used to determine pupil size or eye pose for each eye separately, thereby allowing presentation of image information to each eye to be dynamically tailored to that eye. As another example, the pupil diameter or orientation of only one eye is determined (e.g., based on images acquired for a camera configured to acquire the images of that eye) and the eye features determined for this eye are assumed to be similar for the other eye of the user 210.

As an example, the wearable system 200 can use the outward-facing imaging system 464 or the inward-facing imaging system 462 to acquire images of a pose of the user. The images may be still images, frames of a video, or a video.

The display 220 can be operatively coupled 250, such as by a wired lead or wireless connectivity, to a local data processing module 260 which may be mounted in a variety of configurations, such as fixedly attached to the frame 230, fixedly attached to a helmet or hat worn by the user, embedded in headphones, or otherwise removably attached to the user 210 (e.g., in a backpack-style configuration, in a belt-coupling style configuration).

The local processing and data module 260 may comprise a hardware processor, as well as digital memory, such as non-volatile memory (e.g., flash memory), both of which may be utilized to assist in the processing, caching, and storage of data. The data may include data a) captured from sensors (which may be, e.g., operatively coupled to the frame 230 or otherwise attached to the user 210), such as image capture devices (e.g., cameras in the inward-facing imaging system or the outward-facing imaging system), audio sensors (e.g., microphones), inertial measurement units (e.g., accelerometers, gyroscopes) compasses, global positioning system (GPS) units, radio devices; or b) acquired or processed using remote processing module 270 or remote data repository 280, possibly for passage to the display 220 after such processing or retrieval. The local processing and data module 260 may be operatively coupled by communication links 262 or 264, such as via wired or wireless communication links, to the remote processing module 270 or remote data repository 280 such that these remote modules are available as resources to the local processing and data module 260. In addition, remote processing module 280 and remote data repository 280 may be operatively coupled to each other. In some examples, the local processing and data module 260 can be removably attached to the hip 284 of the viewer 210 in a belt-coupling style configuration as shown in the inset of FIG. 2B.

In some examples, the remote processing module 270 may comprise one or more processors configured to analyze and process data or image information. In some examples, the remote data repository 280 may comprise a digital data storage facility, which may be available through the internet or other networking configuration in a "cloud" resource configuration. In some examples, all data is stored and all computations are performed in the local processing and data module, allowing fully autonomous use from a remote module.

The human visual system is complicated and providing a realistic perception of depth is challenging. Without being limited by theory, it is believed that viewers of an object may perceive the object as being three-dimensional due to a combination of vergence and accommodation. Vergence movements (i.e., rolling movements of the pupils toward or away from each other to converge the lines of sight of the eyes to fixate upon an object) of the two eyes relative to each other are closely associated with focusing (or "accommodation") of the lenses of the eyes. Under normal conditions, changing the focus of the lenses of the eyes, or accommodating the eyes, to change focus from one object to another object at a different distance will automatically cause a matching change in vergence to the same distance, under a relationship known as the "accommodation-vergence reflex." Likewise, a change in vergence will trigger a matching change in accommodation, under normal conditions. Display systems that provide a better match between accommodation and vergence may form more realistic and comfortable simulations of three-dimensional imagery.

Figure 3:
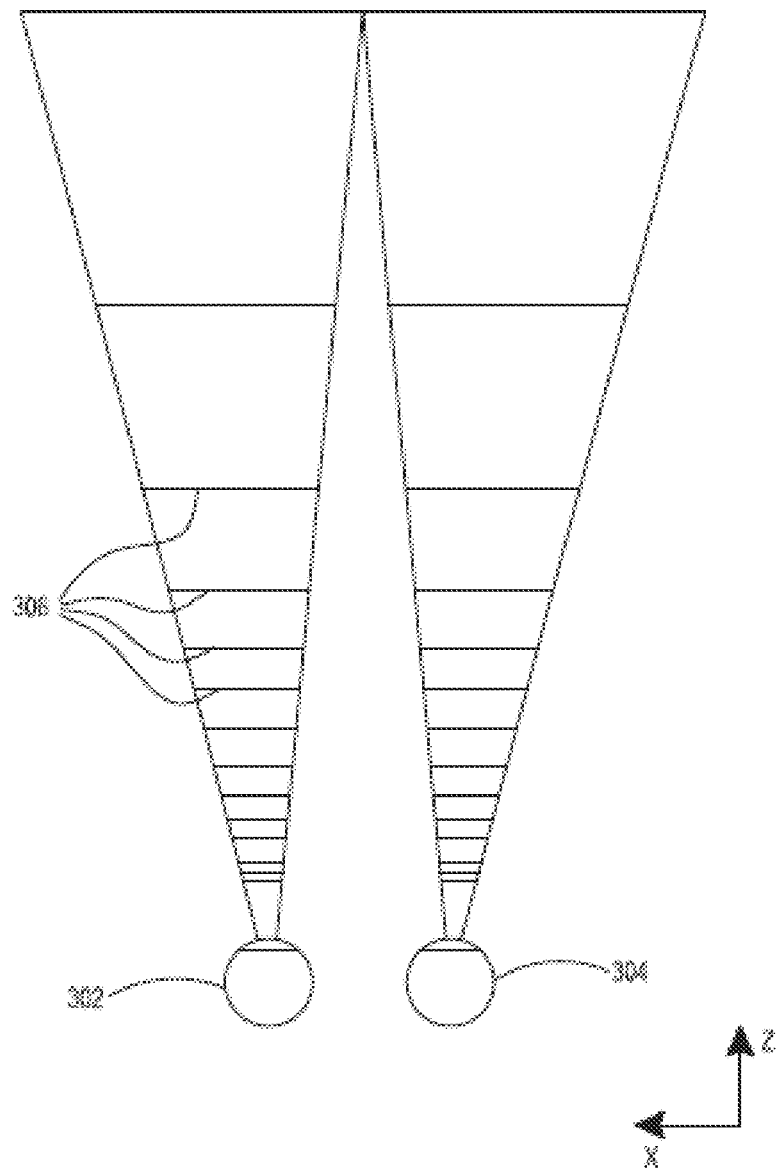
FIG. 3 schematically illustrates aspects of an approach for simulating three-dimensional imagery using multiple depth planes.

FIG. 3 illustrates aspects of an approach for simulating a three-dimensional imagery using multiple depth planes. With reference to FIG. 3, objects at various distances from eyes 302 and 304 on the z-axis are accommodated by the eyes 302 and 304 so that those objects are in focus. The eyes 302 and 304 assume particular accommodated states to bring into focus objects at different distances along the z-axis. Consequently, a particular accommodated state may be said to be associated with a particular one of depth planes 306, which has an associated focal distance, such that objects or parts of objects in a particular depth plane are in focus when the eye is in the accommodated state for that depth plane. In some examples, three-dimensional imagery may be simulated by providing different presentations of an image for each of the eyes 302 and 304, and also by providing different presentations of the image corresponding to each of the depth planes. While shown as being separate for clarity of illustration, it will be appreciated that the fields of view of the eyes 302 and 304 may overlap, for example, as distance along the z-axis increases. In addition, while shown as flat for the ease of illustration, it will be appreciated that the contours of a depth plane may be curved in physical space, such that all features in a depth plane are in focus with the eye in a particular accommodated state. Without being limited by theory, it is believed that the human eye typically can interpret a finite number of depth planes to provide depth perception. Consequently, a highly believable simulation of perceived depth may be achieved by providing, to the eye, different presentations of an image corresponding to each of these limited number of depth planes.

Waveguide Stack Assembly

Figure 4:
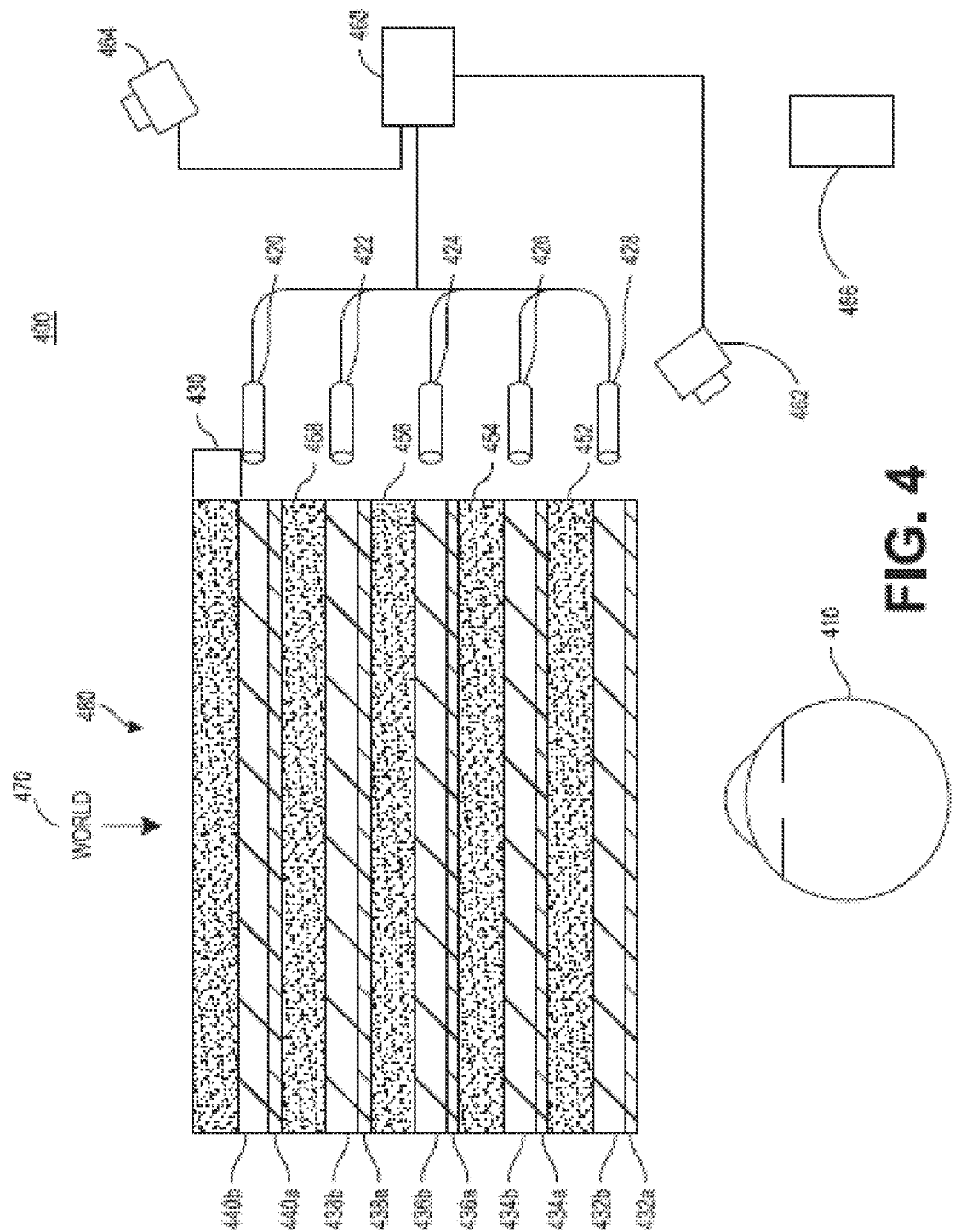
FIG. 4 schematically illustrates an example of a waveguide stack for outputting image information to a user.

FIG. 4 illustrates an example of a waveguide stack for outputting image information to a user. A wearable system 400 includes a stack of waveguides, or stacked waveguide assembly 480 that may be utilized to provide three-dimensional perception to the eye/brain using a plurality of waveguides 432b, 434b, 436b, 438b, 4400b. In some examples, the wearable system 400 may correspond to wearable system 200 of FIG. 2A, with FIG. 4 schematically showing some parts of that wearable system 200 in greater detail. For example, in some examples, the waveguide assembly 480 may be integrated into the display 220 of FIG. 2A.

With continued reference to FIG. 4, the waveguide assembly 480 may also include a plurality of features 458, 456, 454, 452 between the waveguides. In some examples, the features 458, 456, 454, 452 may be lenses. In other examples, the features 458, 456, 454, 452 may not be lenses. Rather, they may simply be spacers (e.g., cladding layers or structures for forming air gaps).

The waveguides 432b, 434b, 436b, 438b, 440b or the plurality of lenses 458, 456, 454, 452 may be configured to send image information to the eye with various levels of wavefront curvature or light ray divergence. Each waveguide level may be associated with a particular depth plane and may be configured to output image information corresponding to that depth plane. Image injection devices 420, 422, 424, 426, 428 may be utilized to inject image information into the waveguides 440b, 438b, 436b, 434b, 432b, each of which may be configured to distribute incoming light across each respective waveguide, for output toward the eye 410 (which may correspond to the eye 304 in FIG. 3). Light exits an output surface of the image injection devices 420, 422, 424, 426, 428 and is injected into a corresponding input edge of the waveguides 440b, 438b, 436b, 434b, 432b. In some examples, a single beam of light (e.g., a collimated beam) may be injected into each waveguide to output an entire field of cloned collimated beams that are directed toward the eye 410 at particular angles (and amounts of divergence) corresponding to the depth plane associated with a particular waveguide.

In some examples, the image injection devices 420, 422, 424, 426, 428 are discrete displays that each produce image information for injection into a corresponding waveguide 440b, 438b, 436b, 434b, 432b, respectively. In some other examples, the image injection devices 420, 422, 424, 426, 428 are the output ends of a single multiplexed display which may, e.g., pipe image information via one or more optical conduits (such as fiber optic cables) to each of the image injection devices 420, 422, 424, 426, 428.

A controller 460 controls the operation of the stacked waveguide assembly 480 and the image injection devices 420, 422, 424, 426, 428. The controller 460 includes programming (e.g., instructions in a non-transitory computer-readable medium) that regulates the timing and provision of image information to the waveguides 440b, 438b, 436b, 434b, 432b. In some examples, the controller 460 may be a single integral device, or a distributed system connected by wired or wireless communication channels. The controller 460 may be part of the processing modules 260 or 270 (illustrated in FIG. 2A) in some examples.

The waveguides 440b, 438b, 436b, 434b, 432b may be configured to propagate light within each respective waveguide by total internal reflection (TIR). The waveguides 440b, 438b, 436b, 434b, 432b may each be planar or have another shape (e.g., curved), with major top and bottom surfaces and edges extending between those major top and bottom surfaces. In the illustrated configuration, the waveguides 440b, 438b, 436b, 434b, 432b may each include light extracting optical elements 440a, 438a, 436a, 434a, 432a that are configured to extract light out of a waveguide by redirecting the light, propagating within each respective waveguide, out of the waveguide to output image information to the eye 410. Extracted light may also be referred to as outcoupled light, and light extracting optical elements may also be referred to as outcoupling optical elements. An extracted beam of light is outputted by the waveguide at locations at which the light propagating in the waveguide strikes a light redirecting element. The light extracting optical elements (440a, 438a, 436a, 434a, 432a) may, for example, be reflective or diffractive optical features. While illustrated disposed at the bottom major surfaces of the waveguides 440b, 438b, 436b, 434b, 432b for ease of description and drawing clarity, in some examples, the light extracting optical elements 440a, 438a, 436a, 434a, 432a may be disposed at the top or bottom major surfaces, or may be disposed directly in the volume of the waveguides 440b, 438b, 436b, 434b, 432b. In some examples, the light extracting optical elements 440a, 438a, 436a, 434a, 432a may be formed in a layer of material that is attached to a transparent substrate to form the waveguides 440b, 438b, 436b, 434b, 432b. In some other examples, the waveguides 440b, 438b, 436b, 434b, 432b may be a monolithic piece of material and the light extracting optical elements 440a, 438a, 436a, 434a, 432a may be formed on a surface or in the interior of that piece of material.

With continued reference to FIG. 4, as discussed herein, each waveguide 440b, 438b, 436b, 434b, 432b is configured to output light to form an image corresponding to a particular depth plane. For example, the waveguide 432b nearest the eye may be configured to deliver collimated light, as injected into such waveguide 432b, to the eye 410. The collimated light may be representative of the optical infinity focal plane. The next waveguide up 434b may be configured to send out collimated light which passes through the first lens 452 (e.g., a negative lens) before it can reach the eye 410. First lens 452 may be configured to create a slight convex wavefront curvature so that the eye/brain interprets light coming from that next waveguide up 434b as coming from a first focal plane closer inward toward the eye 410 from optical infinity. Similarly, the third up waveguide 436b passes its output light through both the first lens 452 and second lens 454 before reaching the eye 410. The combined optical power of the first and second lenses 452 and 454 may be configured to create another incremental amount of wavefront curvature so that the eye/brain interprets light coming from the third waveguide 436b as coming from a second focal plane that is even closer inward toward the person from optical infinity than was light from the next waveguide up 434b.

The other waveguide layers (e.g., waveguides 438b, 440b) and lenses (e.g., lenses 456, 458) are similarly configured, with the highest waveguide 440b in the stack sending its output through all of the lenses between it and the eye for an aggregate focal power representative of the closest focal plane to the person. To compensate for the stack of lenses 458, 456, 454, 452 when viewing/interpreting light coming from the world 470 on the other side of the stacked waveguide assembly 480, a compensating lens layer 430 may be disposed at the top of the stack to compensate for the aggregate power of the lens stack 458, 456, 454, 452 below. Such a configuration provides as many perceived focal planes as there are available waveguide/lens pairings. Both the light extracting optical elements of the waveguides and the focusing aspects of the lenses may be static (e.g., not dynamic or electro-active). In some alternative examples, either or both may be dynamic using electro-active features.

With continued reference to FIG. 4, the light extracting optical elements 440a, 438a, 436a, 434a, 432a may be configured to both redirect light out of their respective waveguides and to output this light with the appropriate amount of divergence or collimation for a particular depth plane associated with the waveguide. As a result, waveguides having different associated depth planes may have different configurations of light extracting optical elements, which output light with a different amount of divergence depending on the associated depth plane. In some examples, as discussed herein, the light extracting optical elements 440a, 438a, 436a, 434a, 432a may be volumetric or surface features, which may be configured to output light at specific angles. For example, the light extracting optical elements 440a, 438a, 436a, 434a, 432a may be volume holograms, surface holograms, and/or diffraction gratings. Light extracting optical elements, such as diffraction gratings, are described in U.S. Patent Publication No. 2015/0178939, published Jun. 25, 2015, which is incorporated by reference herein in its entirety.

In some examples, the light extracting optical elements 440a, 438a, 436a, 434a, 432a are diffractive features that form a diffraction pattern, or "diffractive optical element"

(also referred to herein as a "DOE"). Preferably, the DOE has a relatively low diffraction efficiency so that only a portion of the light of the beam is deflected away toward the eye 410 with each intersection of the DOE, while the rest continues to move through a waveguide via total internal reflection. The light carrying the image information can thus be divided into a number of related exit beams that exit the waveguide at a multiplicity of locations and the result is a fairly uniform pattern of exit emission toward the eye 304 for this particular collimated beam bouncing around within a waveguide.

In some examples, one or more DOEs may be switchable between "on" state in which they actively diffract, and "off" state in which they do not significantly diffract. For instance, a switchable DOE may comprise a layer of polymer dispersed liquid crystal, in which microdroplets comprise a diffraction pattern in a host medium, and the refractive index of the microdroplets can be switched to substantially match the refractive index of the host material (in which case the pattern does not appreciably diffract incident light) or the microdroplet can be switched to an index that does not match that of the host medium (in which case the pattern actively diffracts incident light).

In some examples, the number and distribution of depth planes or depth of field may be varied dynamically based on the pupil sizes or orientations of the eyes of the viewer. Depth of field may change inversely with a viewer's pupil size. As a result, as the sizes of the pupils of the viewer's eyes decrease, the depth of field increases such that one plane that is not discernible because the location of that plane is beyond the depth of focus of the eye may become discernible and appear more in focus with reduction of pupil size and commensurate with the increase in depth of field. Likewise, the number of spaced apart depth planes used to present different images to the viewer may be decreased with the decreased pupil size. For example, a viewer may not be able to clearly perceive the details of both a first depth plane and a second depth plane at one pupil size without adjusting the accommodation of the eye away from one depth plane and to the other depth plane. These two depth planes may, however, be sufficiently in focus at the same time to the user at another pupil size without changing accommodation.

In some examples, the display system may vary the number of waveguides receiving image information based upon determinations of pupil size or orientation, or upon receiving electrical signals indicative of particular pupil size or orientation. For example, if the user's eyes are unable to distinguish between two depth planes associated with two waveguides, then the controller 460 (which may be an example of the local processing and data module 260) can be configured or programmed to cease providing image information to one of these waveguides. Advantageously, this may reduce the processing burden on the system, thereby increasing the responsiveness of the system. In examples in which the DOEs for a waveguide are switchable between the on and off states, the DOEs may be switched to the off state when the waveguide does receive image information.

In some examples, it may be desirable to have an exit beam meet the condition of having a diameter that is less than the diameter of the eye of a viewer. However, meeting this condition may be challenging in view of the variability in size of the viewer's pupils. In some examples, this condition is met over a wide range of pupil sizes by varying the size of the exit beam in response to determinations of the size of the viewer's pupil. For example, as the pupil size decreases, the size of the exit beam may also decrease. In some examples, the exit beam size may be varied using a variable aperture.

The wearable system 400 can include an outward-facing imaging system 464 (e.g., a digital camera) that images a portion of the world 470. This portion of the world 470 may be referred to as the field of view (FOV) of a world camera and the imaging system 464 is sometimes referred to as an FOV camera. The FOV of the world camera may or may not be the same as the FOV of a viewer 210 which encompasses a portion of the world 470 the viewer 210 perceives at a given time. For example, in some situations, the FOV of the world camera may be larger than the viewer 210 of the viewer 210 of the wearable system 400. The entire region available for viewing or imaging by a viewer may be referred to as the field of regard (FOR). The FOR may include $4\pi$ steradians of solid angle surrounding the wearable system 400 because the wearer can move his body, head, or eyes to perceive substantially any direction in space. In other contexts, the wearer's movements may be more constricted, and accordingly the wearer's FOR may subtend a smaller solid angle. Images obtained from the outward-facing imaging system 464 can be used to track gestures made by the user (e.g., hand or finger gestures), detect objects in the world 470 in front of the user, and so forth.

The wearable system 400 can include an audio sensor 232, e.g., a microphone, to capture ambient sound. As described above, in some examples, one or more other audio sensors can be positioned to provide stereo sound reception useful to the determination of location of a speech source. The audio sensor 232 can comprise a directional microphone, as another example, which can also provide such useful directional information as to where the audio source is located. The wearable system 400 can use information from both the outward-facing imaging system 464 and the audio sensor 230 in locating a source of speech, or to determine an active speaker at a particular moment in time, etc. For example, the wearable system 400 can use the voice recognition alone or in combination with a reflected image of the speaker (e.g., as seen in a mirror) to determine the identity of the speaker. As another example, the wearable system 400 can determine a position of the speaker in an environment based on sound acquired from directional microphones. The wearable system 400 can parse the sound coming from the speaker's position with speech recognition algorithms to determine the content of the speech and use voice recognition techniques to determine the identity (e.g., name or other demographic information) of the speaker.

The wearable system 400 can also include an inward-facing imaging system 462 (e.g., a digital camera), which observes the movements of the user, such as the eye movements and the facial movements. The inward-facing imaging system 462 may be used to capture images of the eye 410 to determine the size and/or orientation of the pupil of the eye 304. The inward-facing imaging system 462 can be used to obtain images for use in determining the direction the user is looking (e.g., eye pose) or for biometric identification of the user (e.g., via iris identification). In some examples, at least one camera may be utilized for each eye, to separately determine the pupil size or eye pose of each eye independently, thereby allowing the presentation of image information to each eye to be dynamically tailored to that eye. In some other examples, the pupil diameter or orientation of only a single eye 410 (e.g., using only a single camera per pair of eyes) is determined and assumed to be similar for both eyes of the user. The images obtained by the inward-facing imaging system 462 may be analyzed to determine the user's eye pose or mood, which can be used by the wearable system 400 to decide which audio or visual content should be presented to the user. The wearable system 400 may also determine head pose (e.g., head position or head orientation) using sensors such as inertial measurement units (IMUs), such as, for example, accelerometers, gyroscopes, etc.

The wearable system 400 can include a user input device 466 by which the user can input commands to the controller 460 to interact with the wearable system 400. For example, the user input device 466 can include a trackpad, a touchscreen, a joystick, a multiple degree-of-freedom (DOF) controller, a capacitive sensing device, a game controller, a keyboard, a mouse, a directional pad (D-pad), a wand, a haptic device, a totem (e.g., functioning as a virtual user input device), and so forth. A multi-DOF controller can sense user input in some or all possible translations (e.g., left/right, forward/backward, or up/down) or rotations (e.g., yaw, pitch, or roll) of the controller. A multi-DOF controller which supports the translation movements may be referred to as a 3DOF while a multi-DOF controller which supports the translations and rotations may be referred to as 6DOF. In some cases, the user may use a finger (e.g., a thumb) to press or swipe on a touch-sensitive input device to provide input to the wearable system 400 (e.g., to provide user input to a user interface provided by the wearable system 400). The user input device 466 may be held by the user's hand during the use of the wearable system 400. The user input device 466 can be in wired or wireless communication with the wearable system 400.

Figure 5:
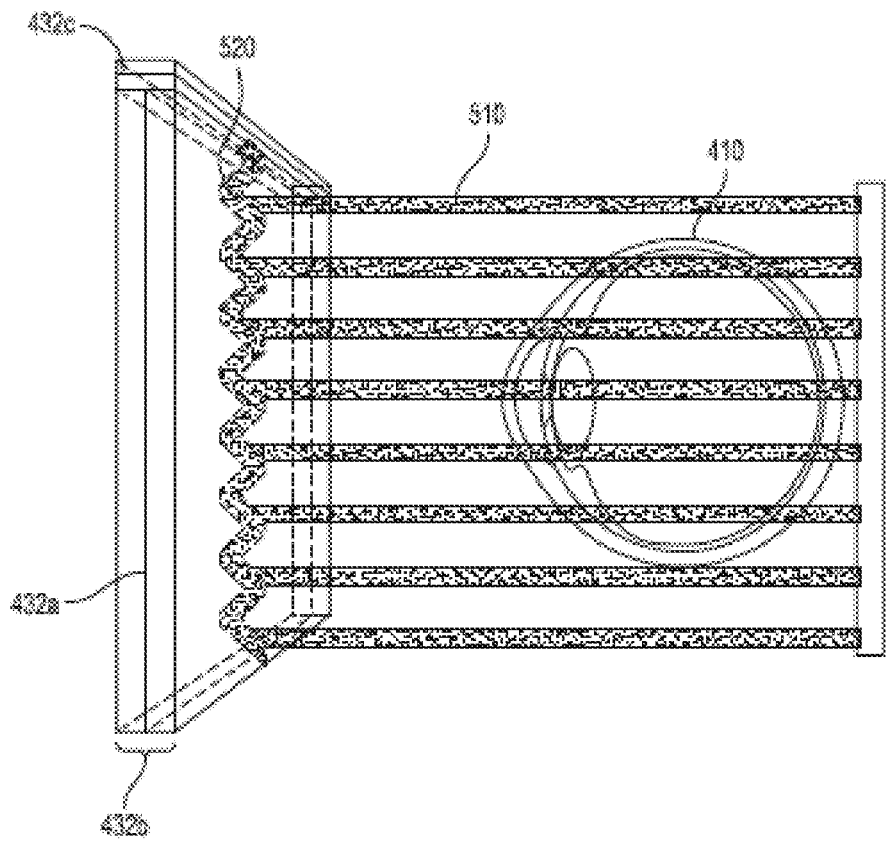
FIG. 5 shows example exit beams that may be outputted by a waveguide.

FIG. 5 shows an example of exit beams outputted by a waveguide. One waveguide is illustrated, but it will be appreciated that other waveguides in the waveguide assembly 480 may function similarly, where the waveguide assembly 480 includes multiple waveguides. Light 520 is injected into the waveguide 432b at the input edge 432c of the waveguide 432b and propagates within the waveguide 432b by TIR. At points where the light 520 impinges on the DOE 432a, a portion of the light exits the waveguide as exit beams 510. The exit beams 510 are illustrated as substantially parallel but they may also be redirected to propagate to the eye 410 at an angle (e.g., forming divergent exit beams), depending on the depth plane associated with the waveguide 432b. It will be appreciated that substantially parallel exit beams may be indicative of a waveguide with light extracting optical elements that outcouple light to form images that appear to be set on a depth plane at a large distance (e.g., optical infinity) from the eye 410. Other waveguides or other sets of light extracting optical elements may output an exit beam pattern that is more divergent, which would require the eye 410 to accommodate to a closer distance to bring it into focus on the retina and would be interpreted by the brain as light from a distance closer to the eye 410 than optical infinity.

Figure 6:
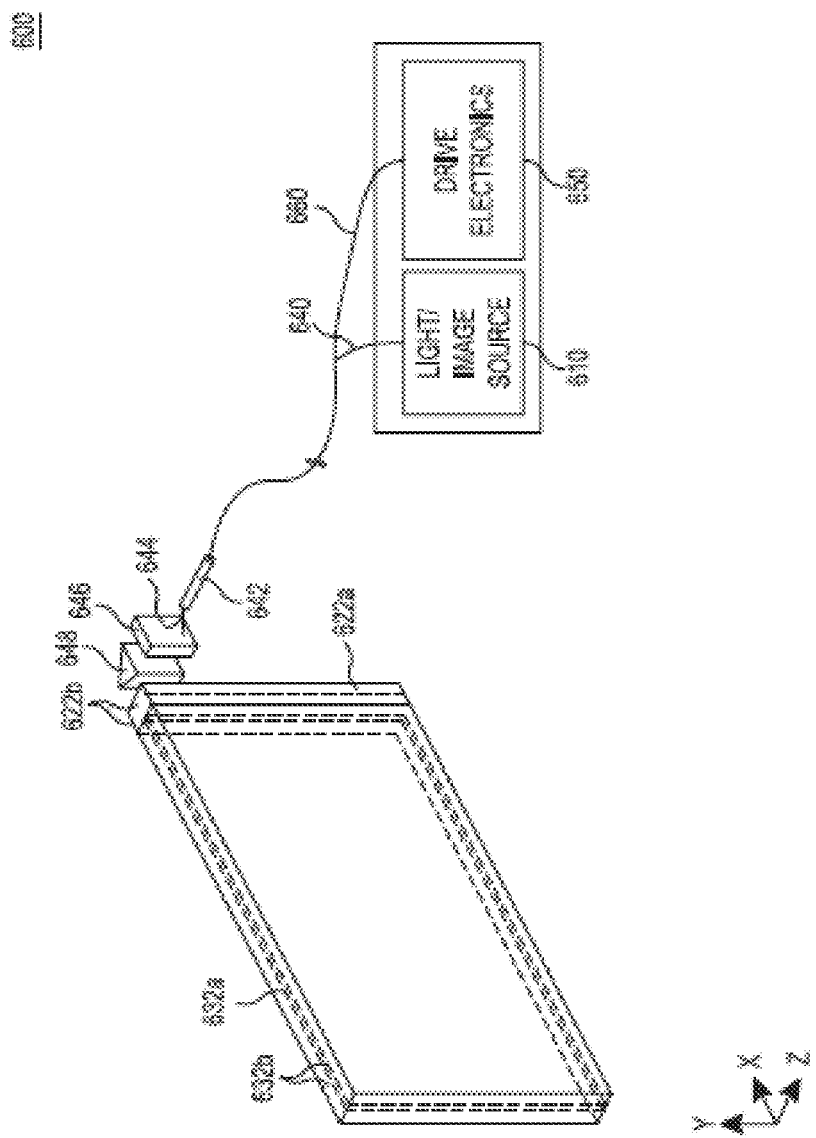
FIG. 6 is a schematic diagram showing an optical system including a waveguide apparatus, an optical coupler subsystem to optically couple light to or from the waveguide apparatus, and a control subsystem, used in the generation of a multi-focal volumetric display, image, or light field.

FIG. 6 is a schematic diagram showing an optical system including a waveguide apparatus, an optical coupler subsystem to optically couple light to or from the waveguide apparatus, and a control subsystem, used in the generation of a multi-focal volumetric display, image, or light field. The optical system can include a waveguide apparatus, an optical coupler subsystem to optically couple light to or from the waveguide apparatus, and a control subsystem. The optical system can be used to generate a multi-focal volumetric image, or light field. The optical system can include one or more primary planar waveguides 632a (only one is shown in FIG. 6) and one or more DOEs 632b associated with each of at least some of the primary waveguides 632a. The planar waveguides 632b can be similar to the waveguides 432b, 434b, 436b, 438b, 440b discussed with reference to FIG. 4. The optical system may employ a distribution waveguide apparatus to relay light along a first axis (vertical or Y-axis in view of FIG. 6), and expand the light's effective exit pupil along the first axis (e.g., Y-axis). The distribution waveguide apparatus may, for example, include a distribution planar waveguide 622b and at least one DOE 622a (illustrated by double dash-dot line) associated with the distribution planar waveguide 622b. The distribution planar waveguide 622b may be similar or identical in at least some respects to the primary planar waveguide 632b, having a different orientation therefrom. Likewise, at least one DOE 622a may be similar to or identical in at least some respects to the DOE 632a. For example, the distribution planar waveguide 622b or DOE 622a may be comprised of the same materials as the primary planar waveguide 632b or DOE 632a, respectively. Examples of the optical display system 600 shown in FIG. 6 can be integrated into the wearable system 200 shown in FIG. 2A.

The relayed and exit-pupil expanded light may be optically coupled from the distribution waveguide apparatus into the one or more primary planar waveguides 632b. The primary planar waveguide 632b can relay light along a second axis, preferably orthogonal to first axis (e.g., horizontal or X-axis in view of FIG. 6). Notably, the second axis can be a non-orthogonal axis to the first axis. The primary planar waveguide 632b expands the light's effective exit pupil along that second axis (e.g., X-axis). For example, the distribution planar waveguide 622b can relay and expand light along the vertical or Y-axis, and pass that light to the primary planar waveguide 632b which can relay and expand light along the horizontal or X-axis.

The optical system may include one or more sources of colored light (e.g., red, green, and blue laser light) 610 which may be optically coupled into a proximal end of a single mode optical fiber 640. A distal end of the optical fiber 640 may be threaded or received through a hollow tube 642 of piezoelectric material. The distal end protrudes from the tube 642 as fixed-free flexible cantilever 644. The piezoelectric tube 642 can be associated with four quadrant electrodes (not illustrated). The electrodes may, for example, be plated on the outside, outer surface or outer periphery or diameter of the tube 642. A core electrode (not illustrated) may also be located in a core, center, inner periphery or inner diameter of the tube 642.

Drive electronics 650, for example electrically coupled via wires 660, drive opposing pairs of electrodes to bend the piezoelectric tube 642 in two axes independently. The protruding distal tip of the optical fiber 644 has mechanical modes of resonance. The frequencies of resonance can depend upon a diameter, length, and material properties of the optical fiber 644. By vibrating the piezoelectric tube 642 near a first mode of mechanical resonance of the fiber cantilever 644, the fiber cantilever 644 can be caused to vibrate, and can sweep through large deflections.

By stimulating resonant vibration in two axes, the tip of the fiber cantilever 644 is scanned biaxially in an area filling two-dimensional (2D) scan. By modulating an intensity of light source(s) 610 in synchrony with the scan of the fiber cantilever 644, light emerging from the fiber cantilever 644 can form an image. Descriptions of such a set up are provided in U.S. Patent Publication No. 2014/0003762, which is incorporated by reference herein in its entirety.

A component of an optical coupler subsystem can collimate the light emerging from the scanning fiber cantilever 644. The collimated light can be reflected by mirrored surface 648 into the narrow distribution planar waveguide 622b which contains the at least one diffractive optical element (DOE) 622a. The collimated light can propagate vertically (relative to the view of FIG. 6) along the distribution planar waveguide 622b by TIR, and in doing so repeatedly intersects with the DOE 622a. The DOE 622a preferably has a low diffraction efficiency. This can cause a fraction (e.g., 10%) of the light to be diffracted toward an edge of the larger primary planar waveguide 632b at each point of intersection with the DOE 622a, and a fraction of the light to continue on its original trajectory down the length of the distribution planar waveguide 622b via TIR.

At each point of intersection with the DOE 622a, additional light can be diffracted toward the entrance of the primary waveguide 632b. By dividing the incoming light into multiple outcoupled sets, the exit pupil of the light can be expanded vertically by the DOE 622a in the distribution planar waveguide 622b. This vertically expanded light coupled out of distribution planar waveguide 622b can enter the edge of the primary planar waveguide 632b.

Light entering primary waveguide 632b can propagate horizontally (relative to the view of FIG. 6) along the primary waveguide 632b via TIR. As the light intersects with DOE 632a at multiple points as it propagates horizontally along at least a portion of the length of the primary waveguide 632b via TIR. The DOE 632a may advantageously be designed or configured to have a phase profile that is a summation of a linear diffraction pattern and a radially symmetric diffractive pattern, to produce both deflection and focusing of the light. The DOE 632a may advantageously have a low diffraction efficiency (e.g., 10%), so that only a portion of the light of the beam is deflected toward the eye of the view with each intersection of the DOE 632a while the rest of the light continues to propagate through the primary waveguide 632b via TIR.

At each point of intersection between the propagating light and the DOE 632a, a fraction of the light is diffracted toward the adjacent face of the primary waveguide 632b allowing the light to escape the TIR, and emerge from the face of the primary waveguide 632b. In some examples, the radially symmetric diffraction pattern of the DOE 632a additionally imparts a focus level to the diffracted light, both shaping the light wavefront (e.g., imparting a curvature) of the individual beam as well as steering the beam at an angle that matches the designed focus level.

Accordingly, these different pathways can cause the light to be coupled out of the primary planar waveguide 632b by a multiplicity of DOEs 632a at different angles, focus levels, or yielding different fill patterns at the exit pupil. Different fill patterns at the exit pupil can be beneficially used to create a light field display with multiple depth planes. Each layer in the waveguide assembly or a set of layers (e.g., 3 layers) in the stack may be employed to generate a respective color (e.g., red, blue, green). Thus, for example, a first set of three adjacent layers may be employed to respectively produce red, blue and green light at a first focal depth. A second set of three adjacent layers may be employed to respectively produce red, blue and green light at a second focal depth. Multiple sets may be employed to generate a full 3D or 4D color image light field with various focal depths.

Other Components of the Wearable System

In many implementations, the wearable system may include other components in addition or in alternative to the components of the wearable system described above. The wearable system may, for example, include one or more haptic devices or components. The haptic devices or components may be operable to provide a tactile sensation to a user. For example, the haptic devices or components may provide a tactile sensation of pressure or texture when touching virtual content (e.g., virtual objects, virtual tools, other virtual constructs). The tactile sensation may replicate a feel of a physical object which a virtual object represents, or may replicate a feel of an imagined object or character (e.g., a dragon) which the virtual content represents. In some implementations, haptic devices or components may be worn by the user (e.g., a user wearable glove). In some implementations, haptic devices or components may be held by the user.

The wearable system may, for example, include one or more physical objects which are manipulable by the user to allow input or interaction with the wearable system. These physical objects may be referred to herein as totems. Some totems may take the form of inanimate objects, such as for example, a piece of metal or plastic, a wall, a surface of table. In certain implementations, the totems may not actually have any physical input structures (e.g., keys, triggers, joystick, trackball, rocker switch). Instead, the totem may simply provide a physical surface, and the wearable system may render a user interface so as to appear to a user to be on one or more surfaces of the totem. For example, the wearable system may render an image of a computer keyboard and trackpad to appear to reside on one or more surfaces of a totem. For example, the wearable system may render a virtual computer keyboard and virtual trackpad to appear on a surface of a thin rectangular plate of aluminum which serves as a totem. The rectangular plate does not itself have any physical keys or trackpad or sensors. However, the wearable system may detect user manipulation or interaction or touches with the rectangular plate as selections or inputs made via the virtual keyboard or virtual trackpad. The user input device 466 (shown in FIG. 4) may be an examples of a totem, which may include a trackpad, a touchpad, a trigger, a joystick, a trackball, a rocker or virtual switch, a mouse, a keyboard, a multi-degree-of-freedom controller, or another physical input device. A user may use the totem, alone or in combination with poses, to interact with the wearable system or other users.

Examples of haptic devices and totems usable with the wearable devices, HMD, and display systems of the present disclosure are described in U.S. Patent Publication No. 2015/0016777, which is incorporated by reference herein in its entirety.

Example Wearable Systems, Environments, and Interfaces

A wearable system may employ various mapping related techniques in order to achieve high depth of field in the rendered light fields. In mapping out the virtual world, it is advantageous to know all the features and points in the real world to accurately portray virtual objects in relation to the real world. To this end, FOV images captured from users of the wearable system can be added to a world model by including new pictures that convey information about various points and features of the real world. For example, the wearable system can collect a set of map points (such as 2D points or 3D points) and find new map points to render a more accurate version of the world model. The world model of a first user can be communicated (e.g., over a network such as a cloud network) to a second user so that the second user can experience the world surrounding the first user.

Figure 7:
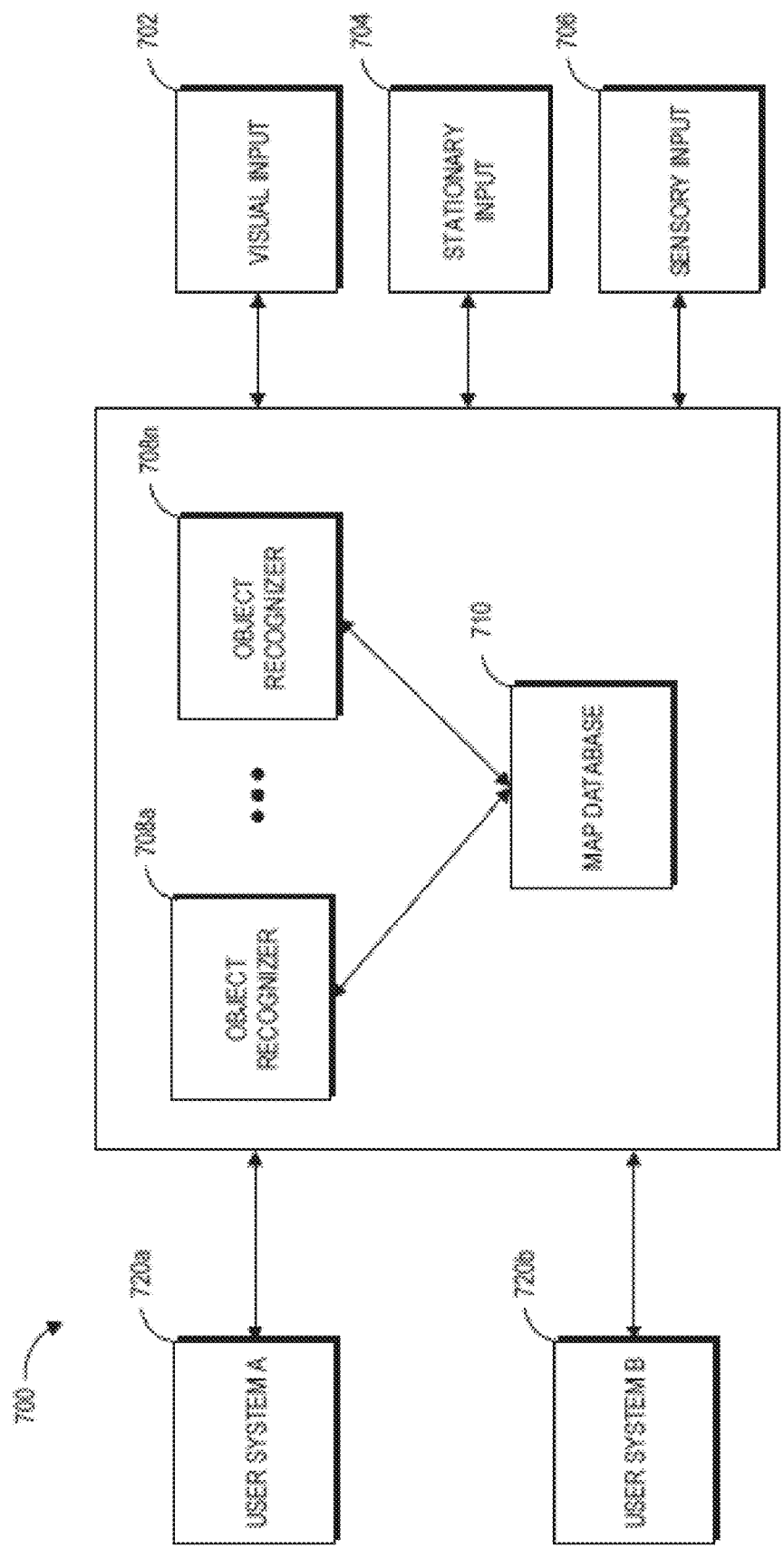
FIG. 7 is a block diagram of an example of a wearable system.

FIG. 7 is a block diagram of an example of an MR environment 700. The MR environment 700 may be configured to receive input (e.g., visual input 702 from the user's wearable system, stationary input 704 such as room cameras, sensory input 706 from various sensors, gestures, totems, eye tracking, user input from the user input device 466 etc.) from one or more user wearable systems (e.g., wearable system 200 or display system 220) or stationary room cameras, etc.). The wearable systems can use various sensors (e.g., accelerometers, gyroscopes, temperature sensors, movement sensors, depth sensors, GPS sensors, inward-facing imaging system, outward-facing imaging system, etc.) to determine the location and various other attributes of the environment of the user. This information may further be supplemented with information from stationary cameras in the room that may provide images or various cues from a different point of view. The image data acquired by the cameras (such as the room cameras and/or the cameras of the outward-facing imaging system) may be reduced to a set of mapping points.

One or more object recognizers 708 can crawl through the received data (e.g., the collection of points) and recognize or map points, tag images, attach semantic information to objects with the help of a map database 710. The map database 710 may comprise various points collected over time and their corresponding objects. The various devices and the map database can be connected to each other through a network (e.g., LAN, WAN, etc.) to access the cloud.

Based on this information and collection of points in the map database, the object recognizers 708a to 708n may recognize objects in an environment. For example, the object recognizers can recognize faces, persons, windows, walls, user input devices, televisions, documents (e.g., travel tickets, driver's license, passport as described in the security examples herein), other objects in the user's environment, etc. One or more object recognizers may be specialized for object with certain characteristics. For example, the object recognizer 708a may be used to recognizer faces, while another object recognizer may be used recognize documents.

The object recognitions may be performed using a variety of computer vision techniques. For example, the wearable system can analyze the images acquired by the outward-facing imaging system 464 (shown in FIG. 4) to perform scene reconstruction, event detection, video tracking, object recognition (e.g., persons or documents), object pose estimation, facial recognition (e.g., from a person in the environment or an image on a document), learning, indexing, motion estimation, or image analysis (e.g., identifying indicia within documents such as photos, signatures, identification information, travel information, etc.), and so forth. One or more computer vision algorithms may be used to perform these tasks. Non-limiting examples of computer vision algorithms include: Scale-invariant feature transform (SIFT), speeded up robust features (SURF), oriented FAST and rotated BRIEF (ORB), binary robust invariant scalable keypoints (BRISK), fast retina keypoint (FREAK), Viola-Jones algorithm, Eigenfaces approach, Lucas-Kanade algorithm, Horn-Schunk algorithm, Mean-shift algorithm, visual simultaneous location and mapping (vSLAM) techniques, a sequential Bayesian estimator (e.g., Kalman filter, extended Kalman filter, etc.), bundle adjustment, Adaptive thresholding (and other thresholding techniques), Iterative Closest Point (ICP), Semi Global Matching (SGM), Semi Global Block Matching (SGBM), Feature Point Histograms, various machine learning algorithms (such as e.g., support vector machine, k-nearest neighbors algorithm, Naive Bayes, neural network (including convolutional or deep neural networks), or other supervised/unsupervised models, etc.), and so forth.

The object recognitions can additionally or alternatively be performed by a variety of machine learning algorithms. Once trained, the machine learning algorithm can be stored by the HMD. Some examples of machine learning algorithms can include supervised or non-supervised machine learning algorithms, including regression algorithms (such as, for example, Ordinary Least Squares Regression), instance-based algorithms (such as, for example, Learning Vector Quantization), decision tree algorithms (such as, for example, classification and regression trees), Bayesian algorithms (such as, for example, Naive Bayes), clustering algorithms (such as, for example, k-means clustering), association rule learning algorithms (such as, for example, a-priori algorithms), artificial neural network algorithms (such as, for example, Perceptron), deep learning algorithms (such as, for example, Deep Boltzmann Machine, or deep neural network), dimensionality reduction algorithms (such as, for example, Principal Component Analysis), ensemble algorithms (such as, for example, Stacked Generalization), and/or other machine learning algorithms. In some examples, individual models can be customized for individual data sets. For example, the wearable device can generate or store a base model. The base model may be used as a starting point to generate additional models specific to a data type (e.g., a particular user in the telepresence session), a data set (e.g., a set of additional images obtained of the user in the telepresence session), conditional situations, or other variations. In some examples, the wearable HMD can be configured to utilize a plurality of techniques to generate models for analysis of the aggregated data. Other techniques may include using pre-defined thresholds or data values.

Based on this information and collection of points in the map database, the object recognizers 708a to 708n may recognize objects and supplement objects with semantic information to give life to the objects. For example, if the object recognizer recognizes a set of points to be a door, the system may attach some semantic information (e.g., the door has a hinge and has a 90 degree movement about the hinge). If the object recognizer recognizes a set of points to be a mirror, the system may attach semantic information that the mirror has a reflective surface that can reflect images of objects in the room. The semantic information can include affordances of the objects as described herein. For example, the semantic information may include a normal of the object. The system can assign a vector whose direction indicates the normal of the object. Over time the map database grows as the system (which may reside locally or may be accessible through a wireless network) accumulates more data from the world. Once the objects are recognized, the information may be transmitted to one or more wearable systems. For example, the MR environment 700 may include information about a scene happening in California. The environment 700 may be transmitted to one or more users in New York. Based on data received from an FOV camera and other inputs, the object recognizers and other software components can map the points collected from the various images, recognize objects etc., such that the scene may be accurately "passed over" to a second user, who may be in a different part of the world. The environment 700 may also use a topological map for localization purposes.

Figure 8:
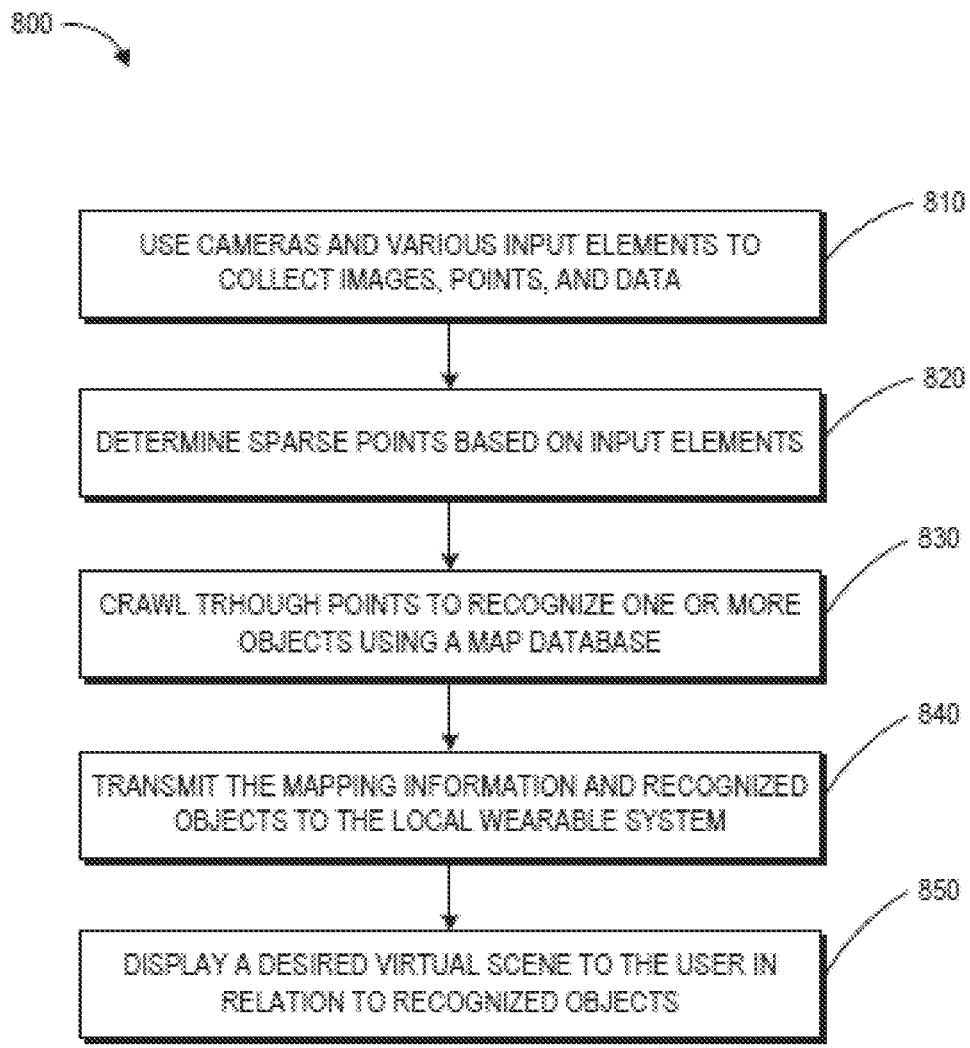
FIG. 8 is a process flow diagram of an example of a method of rendering virtual content in relation to recognized objects.

FIG. 8 is a process flow diagram of an example of a method 800 of rendering virtual content in relation to recognized objects. The method 800 describes how a virtual scene may be presented to a user of the wearable system. The user may be geographically remote from the scene. For example, the user may be in New York, but may want to view a scene that is presently going on in California, or may want to go on a walk with a friend who resides in California.

At block 810, the wearable system may receive input from the user and other users regarding the environment of the user. This may be achieved through various input devices, and knowledge already possessed in the map database. The user's FOV camera, sensors, GPS, eye tracking, etc., convey information to the system at block 810. The system may determine sparse points based on this information at block 820. The sparse points may be used in determining pose data (e.g., head pose, eye pose, body pose, or hand gestures) that can be used in displaying and understanding the orientation and position of various objects in the user's surroundings. The object recognizers 708a-708n may crawl through these collected points and recognize one or more objects using a map database at block 830. This information may then be conveyed to the user's individual wearable system at block 840, and the desired virtual scene may be accordingly displayed to the user at block 850. For example, the desired virtual scene (e.g., user in CA) may be displayed at the appropriate orientation, position, etc., in relation to the various objects and other surroundings of the user in New York.

Figure 9:
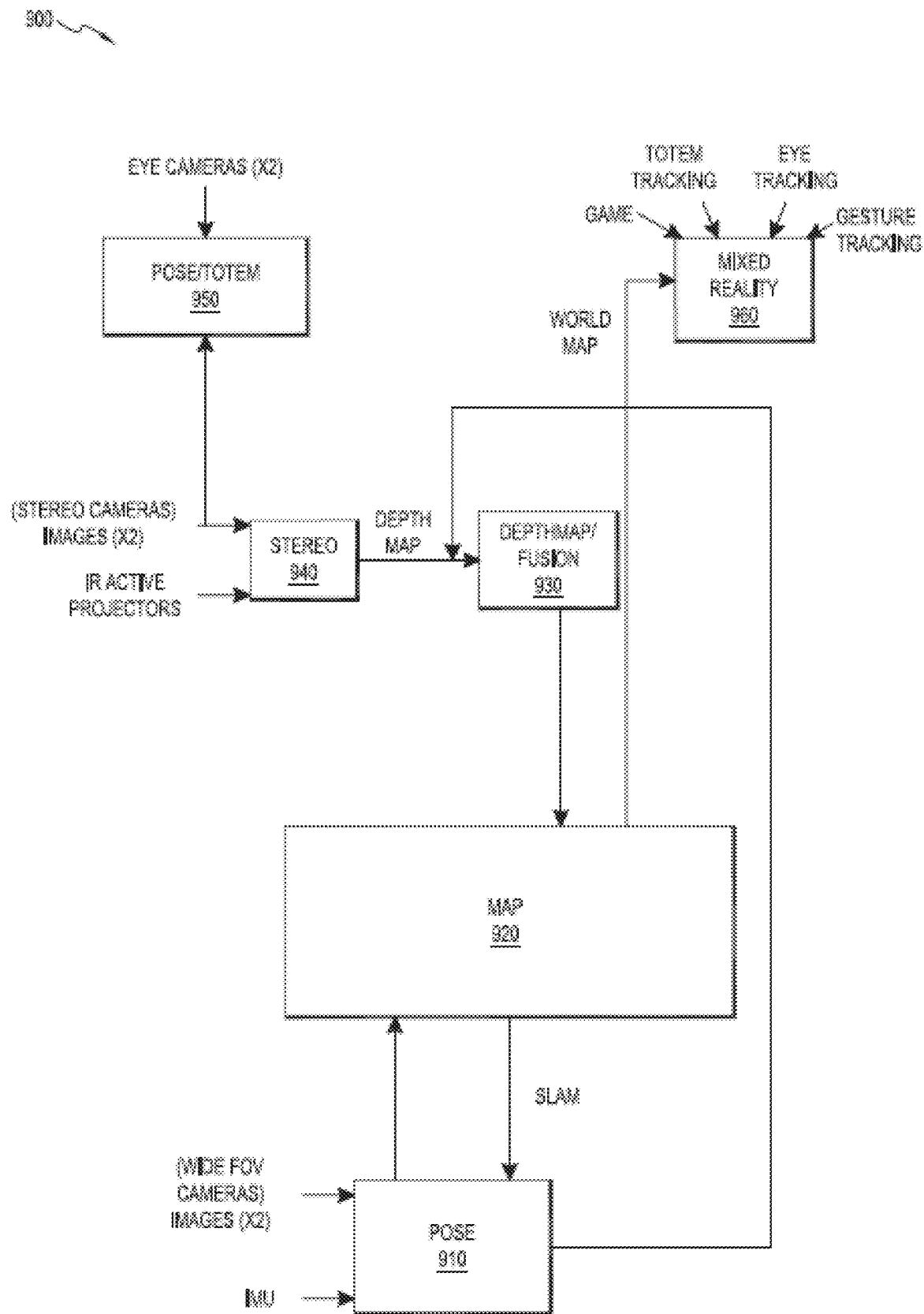
FIG. 9 is a block diagram of another example of a wearable system.

FIG. 9 is a block diagram of another example of a wearable system. In this example, the wearable system 900 comprises a map 920, which may include the map database 710 containing map data for the world. The map may partly reside locally on the wearable system, and may partly reside at networked storage locations accessible by wired or wireless network (e.g., in a cloud system). A pose process 910 may be executed on the wearable computing architecture (e.g., processing module 260 or controller 460) and utilize data from the map 920 to determine position and orientation of the wearable computing hardware or user. Pose data may be computed from data collected on the fly as the user is experiencing the system and operating in the world. The data may comprise images, data from sensors (such as inertial measurement units (IMUs), which generally comprise accelerometer and gyroscope components) and surface information pertinent to objects in the real or virtual environment.

A sparse point representation may be the output of a simultaneous localization and mapping (e.g., SLAM or vSLAM, referring to a configuration wherein the input is images/visual only) process. The system can be configured to not only find out where in the world the various components are, but what the world is made of. Pose may be a building block that achieves many goals, including populating the map and using the data from the map.

In one example, a sparse point position may not be completely adequate on its own, and further information may be needed to produce a multifocal AR, VR, or MR experience. Dense representations, generally referring to depth map information, may be utilized to fill this gap at least in part. Such information may be computed from a process referred to as Stereo 940, wherein depth information is determined using a technique such as triangulation or time-of-flight sensing. Image information and active patterns (such as infrared patterns created using active projectors), images acquired from image cameras, or hand gestures/totem 950 may serve as input to the Stereo process 940. A significant amount of depth map information may be fused together, and some of this may be summarized with a surface representation. For example, mathematically definable surfaces may be efficient (e.g., relative to a large point cloud) and digestible inputs to other processing devices like game engines. Thus, the output of the stereo process (e.g., a depth map) 940 may be combined in the fusion process 930. Pose 910 may be an input to this fusion process 930 as well, and the output of fusion 930 becomes an input to populating the map process 920. Sub-surfaces may connect with each other, such as in topographical mapping, to form larger surfaces, and the map becomes a large hybrid of points and surfaces.

To resolve various aspects in a mixed reality process 960, various inputs may be utilized. For example, in the example depicted in FIG. 9, Game parameters may be inputs to determine that the user of the system is playing a monster battling game with one or more monsters at various locations, monsters dying or running away under various conditions (such as if the user shoots the monster), walls or other objects at various locations, and the like. The world map may include information regarding the location of the objects or semantic information of the objects and the world map can be another valuable input to mixed reality. Pose relative to the world becomes an input as well and plays a key role to almost any interactive system.

Controls or inputs from the user are another input to the wearable system 900. As described herein, user inputs can include visual input, gestures, totems, audio input, sensory input, etc. In order to move around or play a game, for example, the user may need to instruct the wearable system 900 regarding what he or she wants to do. Beyond just moving oneself in space, there are various forms of user controls that may be utilized. In one example, a totem (e.g. a user input device), or an object such as a toy gun may be held by the user and tracked by the system. The system preferably will be configured to know that the user is holding the item and understand what kind of interaction the user is having with the item (e.g., if the totem or object is a gun, the system may be configured to understand location and orientation, as well as whether the user is clicking a trigger or other sensed button or element which may be equipped with a sensor, such as an IMU, which may assist in determining what is going on, even when such activity is not within the field of view of any of the cameras.)

Hand gesture tracking or recognition may also provide input information. The wearable system 900 may be configured to track and interpret hand gestures for button presses, for gesturing left or right, stop, grab, hold, etc. For example, in one configuration, the user may want to flip through emails or a calendar in a non-gaming environment, or do a "fist bump" with another person or player. The wearable system 900 may be configured to leverage a minimum amount of hand gesture, which may or may not be dynamic. For example, the gestures may be simple static gestures like open hand for stop, thumbs up for ok, thumbs down for not ok; or a hand flip right, or left, or up/down for directional commands.

Eye tracking is another input (e.g., tracking where the user is looking to control the display technology to render at a specific depth or range). In one example, vergence of the eyes may be determined using triangulation, and then using a vergence/accommodation model developed for that particular person, accommodation may be determined. Eye tracking can be performed by the eye camera(s) to determine eye gaze (e.g., direction or orientation of one or both eyes). Other techniques can be used for eye tracking such as, e.g., measurement of electrical potentials by electrodes placed near the eye(s) (e.g., electrooculography).

Speech tracking can be another input can be used alone or in combination with other inputs (e.g., totem tracking, eye tracking, gesture tracking, etc.). Speech tracking may include speech recognition, voice recognition, alone or in combination. The system 900 can include an audio sensor (e.g., a microphone) that receives an audio stream from the environment. The system 900 can incorporate voice recognition technology to determine who is speaking (e.g., whether the speech is from the wearer of the ARD or another person or voice (e.g., a recorded voice transmitted by a loudspeaker in the environment)) as well as speech recognition technology to determine what is being said. The local data & processing module 260 or the remote processing module 270 can process the audio data from the microphone (or audio data in another stream such as, e.g., a video stream being watched by the user) to identify content of the speech by applying various speech recognition algorithms, such as, e.g., hidden Markov models, dynamic time warping (DTW)-based speech recognitions, neural networks, deep learning algorithms such as deep feedforward and recurrent neural networks, end-to-end automatic speech recognitions, machine learning algorithms (described with reference to FIG. 7), or other algorithms that uses acoustic modeling or language modeling, etc.

The local data & processing module 260 or the remote processing module 270 can also apply voice recognition algorithms which can identify the identity of the speaker, such as whether the speaker is the user 210 of the wearable system 900 or another person with whom the user is conversing. Some example voice recognition algorithms can include frequency estimation, hidden Markov models, Gaussian mixture models, pattern matching algorithms, neural networks, matrix representation, Vector Quantization, speaker diarisation, decision trees, and dynamic time warping (DTW) technique. Voice recognition techniques can also include anti-speaker techniques, such as cohort models, and world models. Spectral features may be used in representing speaker characteristics. The local data & processing module or the remote data processing module 270 can use various machine learning algorithms described with reference to FIG. 7 to perform the voice recognition.

With regard to the camera systems, the example wearable system 900 shown in FIG. 9 can include three pairs of cameras: a relative wide FOV or passive SLAM pair of cameras arranged to the sides of the user's face, a different pair of cameras oriented in front of the user to handle the stereo imaging process 940 and also to capture hand gestures and totem/object tracking in front of the user's face. The FOV cameras and the pair of cameras for the stereo process 940 may be a part of the outward-facing imaging system 464 (shown in FIG. 4). The wearable system 900 can include eye tracking cameras (which may be a part of an inward-facing imaging system 462 shown in FIG. 4) oriented toward the eyes of the user in order to triangulate eye vectors and other information. The wearable system 900 may also comprise one or more textured light projectors (such as infrared (IR) projectors) to inject texture into a scene.

Figure 10:
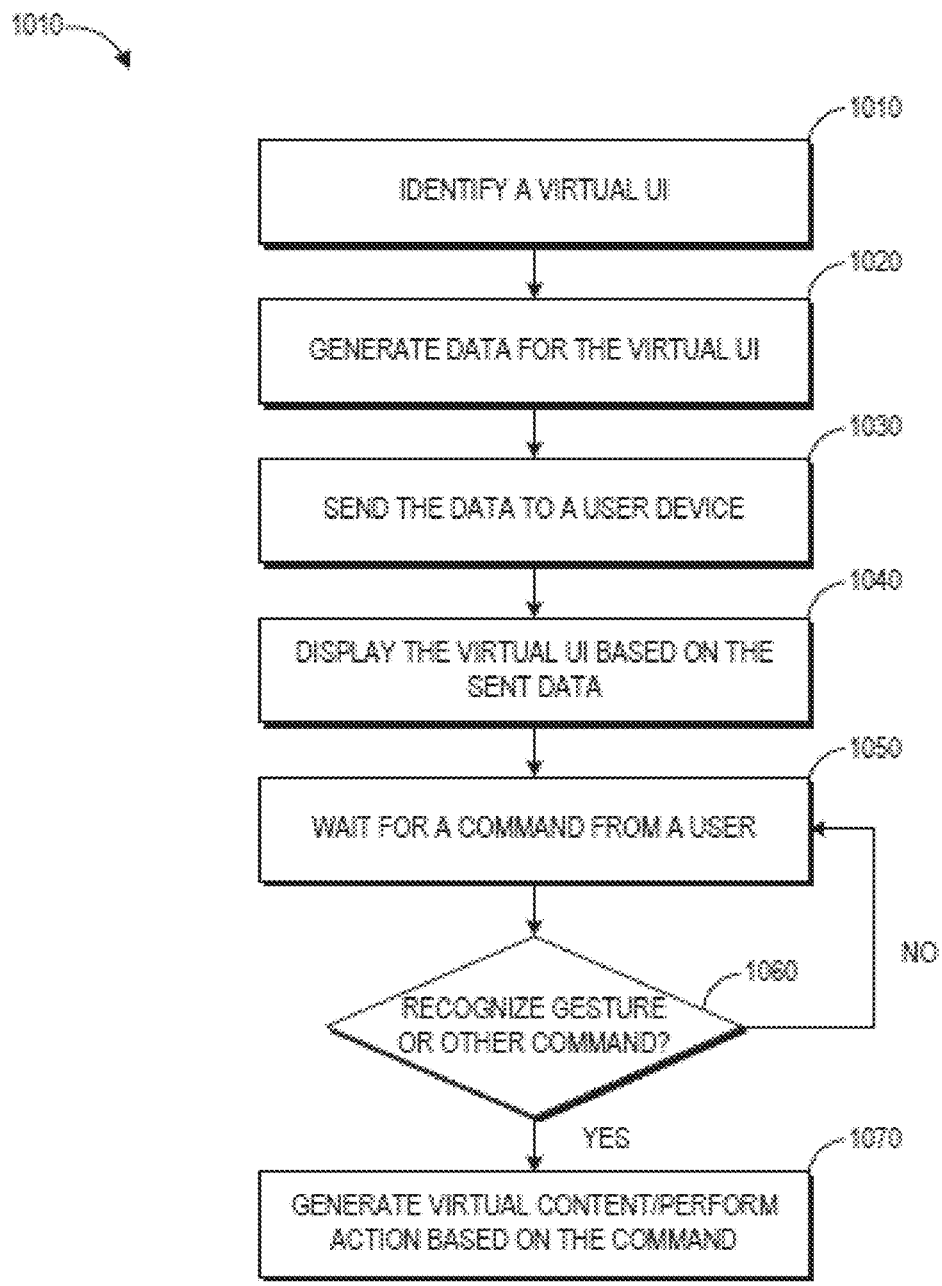
FIG. 10 is a process flow diagram of an example of a method for interacting with a virtual user interface.

FIG. 10 is a process flow diagram of an example of a method 1000 for interacting with a virtual user interface. The method 1000 may be performed by the wearable system described herein. The method 1000 may perform the method 1000 in a telepresence session.

At block 1010, the wearable system may identify a particular UI. The type of UI may be predetermined by the user. The wearable system may identify that a particular UI needs to be populated based on a user input (e.g., gesture, visual data, audio data, sensory data, direct command, etc.). The UI may be specific to a telepresence session. At block 1020, the wearable system may generate data for the virtual UI. For example, data associated with the confines, general structure, shape of the UI etc., may be generated. In addition, the wearable system may determine map coordinates of the user's physical location so that the wearable system can display the UI in relation to the user's physical location. For example, if the UI is body centric, the wearable system may determine the coordinates of the user's physical stance, head pose, or eye pose such that a ring UI can be displayed around the user or a planar UI can be displayed on a wall or in front of the user. In the telepresence context, the UI may be displayed as if the UI were surrounding user to create a tangible sense of another user's presence in the environment (e.g., the UI can display virtual avatars of the participants around the user). If the UI is hand centric, the map coordinates of the user's hands may be determined. These map points may be derived through data received through the FOV cameras, sensory input, or any other type of collected data.

At block 1030, the wearable system may send the data to the display from the cloud or the data may be sent from a local database to the display components. At block 1040, the UI is displayed to the user based on the sent data. For example, a light field display can project the virtual UI into one or both of the user's eyes. Once the virtual UI has been created, the wearable system may simply wait for a command from the user to generate more virtual content on the virtual UI at block 1050. For example, the UI may be a body centric ring around the user's body or the body of a person in the user's environment (e.g., a traveler). The wearable system may then wait for the command (a gesture, a head or eye movement, voice command, input from a user input device, etc.), and if it is recognized (block 1060), virtual content associated with the command may be displayed to the user (block 1070).

Figure 11:
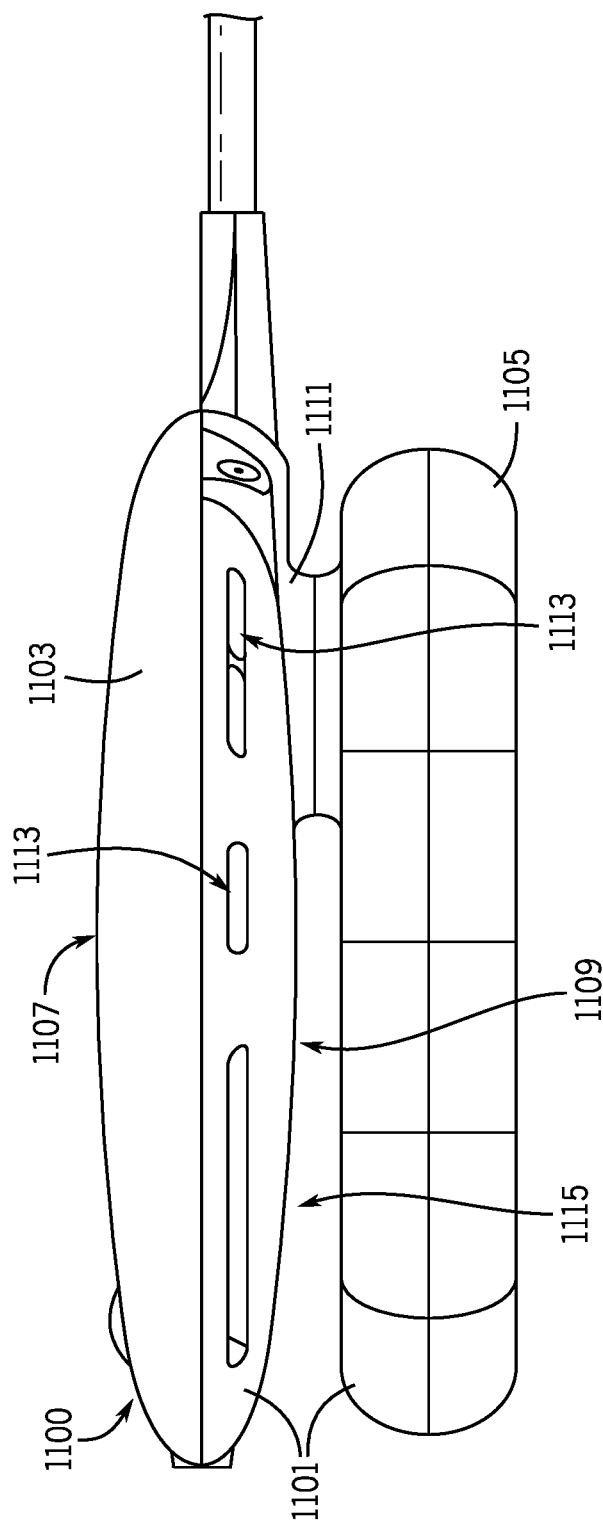
FIG. 11 is a schematic side view of an example of a wearable electronic device.

Preventing Accidental Actuation of User Control Interfaces when Wearing or Putting on a Wearable Electronic Device FIG. 11 is a schematic side view of an example of a wearable electronic device 1100. The example of the wearable electronic device 1100 can be similar to or comprise the local processing and data module 260. The example of the wearable electronic device 1100 depicted in FIG. 11 can be removably attached to a portion of the user's clothing, belt or some other accessory worn by the user or a lanyard disposed around the user's neck, shoulder, wrist or arm, etc. As shown in FIG. 11, the example of the wearable electronic device 1100 can comprise a housing 1101 comprising a first portion 1103 and a second portion 1105 mechanically connected with the first portion 1103. A portion of the first portion 1103 and the second portion 1105 can be spaced apart by a gap 1115 as shown in FIG. 11. The size of the gap 1115 measured as a distance between the first portion 1103 and the second portion 1105 can be less than or equal to about 5 mm.

The first portion 1103 can comprise a front side 1107 and a back side 1109 opposite the front side 1107. The second portion 1105 can be coupled with the back side 1109 of the first portion 1103 via a connecting region 1111. The housing 1101 can include one or more user interfaces 1113. In some examples, the one or more user interfaces 1113 can be disposed on a periphery of the first portion 1103 as shown in FIG. 11. The one or more user control interfaces 1113 can be configured to enable the user to control the operation of the wearable system (e.g., wearable system 200). For example, the one or more user control interfaces 1113 can be configured to control a parameter of the speaker 240 and/or the display 220 of wearable system 200. In some examples, the user control interfaces 1113 can comprise buttons, scroll wheels, switches, or other types of interfaces to control the volume of the AR or VR experience, and/or to mute the volume. In some examples, the user control interfaces 1113 can comprise buttons or other types of interfaces (e.g., touch surfaces) to control the brightness, contrast and/or color of the display 220. Other control mechanisms are also possible through the control interfaces 1113 such as a content pause function, power button, video recording, camera, phone call or hang up button, etc. Without any loss of generality, the one or more user control interfaces 1113 can comprise capacitive sensors (e.g., capacitive touch sensors) that are sensitive to touch input from the user. In some examples, the one or more user control interfaces 1113 can comprise touch sensitive surfaces (e.g., a touch screen). In addition, the housing 1101 can also include input/output (I/O) ports (e.g., audio port) to provide input and/or output data.

Various examples of the wearable electronic device 1100 may include one or multiple electronic components, such as processors, memory dies, sensors, control systems, etc. One or more of the electronic components can be disposed within a chamber or a compartment of the first portion 1103 of the housing 1101. One or more of the electronic components can be arranged within a relatively low profile and a relatively small lateral footprint. Various examples of the electronic device 1100 may also include an electrical power supply system. In various examples, the electrical power supply system can be disposed within the second portion 1105 of the housing 1101. The electrical power supply system can be configured to provide power to the electronic components in the first portion 1103 and/or other components of the wearable system 200, such as, for example, the display 220, the speaker 240 and/or the audio sensor 232 such that the user need not be tethered to a wired, stationary power supply. Other configurations are also possible. For example, in some examples the electrical power supply system can be disposed in the first portion 1103 and one or more of the electronic components can be disposed in the second portion 1105.

Figure 12B:
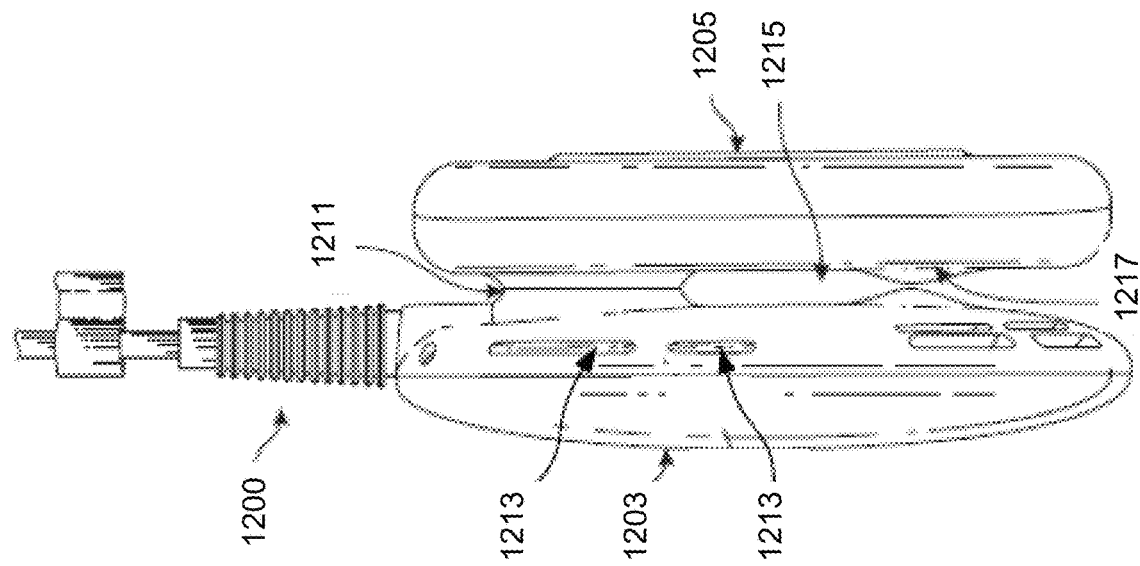
FIGS. 12A and 12B are schematic right and left side views of another example of a wearable electronic device.
Figure 12A:
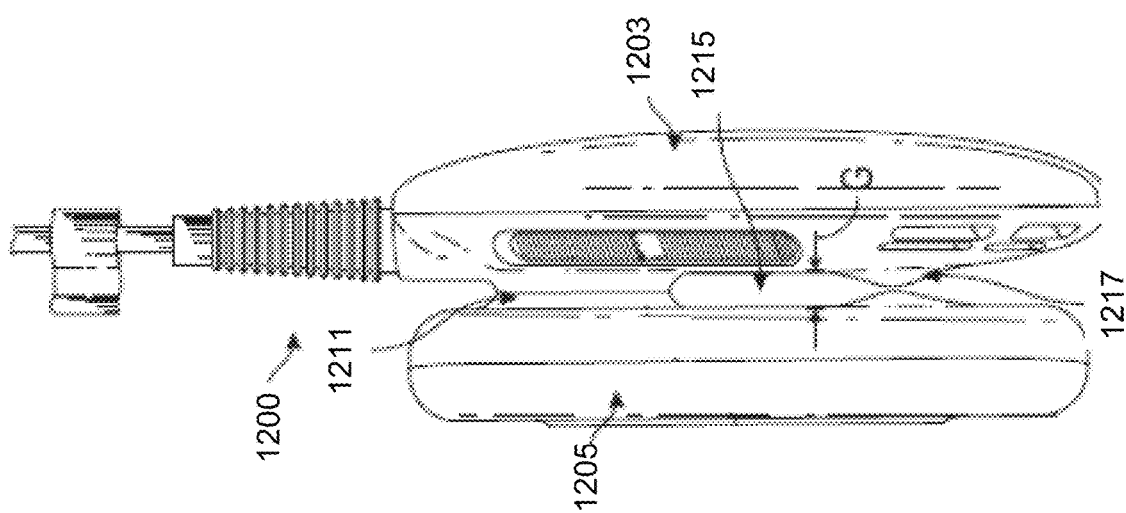

FIGS. 12A and 12B are schematic right and left side views of another example of an electronic device 1200. Various examples of the electronic device 1200 are configured to be wearable. The electronic device 1200 can be similar to the example of the electronic device 1100 described above. For example, similar to the example of the electronic device 1100 described above, the electronic device 1200 can comprise a second portion 1205 coupled to a first portion 1203 at a connecting region 1211. The connecting region 1211 can also be referred to herein as a joint. The first portion 1203 is separated from the second portion 1205 by a gap 1215. The electronic device 1200 can comprise one or more user control interfaces 1213 disposed on the periphery of the first portion 1203. Similar to the one or more user control interfaces 1113, the one or more user control interfaces 1213 can be configured to control one or more parameters of the wearable system. The first portion 1203 can comprise one or multiple electronic components, such as processors, memory dies, sensors, control systems, etc. The second portion 1205 can comprise an electrical power supply system (e.g., a battery pack). Other configurations are also possible. For example, the first portion 1203 can comprise an electrical power supply system (e.g., a battery pack) and the second portion 1205 can comprise one or multiple electronic components, such as processors, memory dies, sensors, control systems, etc. Various examples of the electronic device 1200 can be similar to and/or comprise the local processing and data module 260.

The first and the second portions 1203 and 1205 can comprise a clip 1217 disposed within the gap 1215. The clip 1217 can be formed by a pair of projections extending from the first portion 1203 and second portions 1205. The projections extending from the first and second portion 1203 and 1205 that form the clip 1217 can be separated by a second gap having a distance less than the distance of the gap 1215. For example, the second gap between the projections extending from the first and second portions 1203 and 1205 that form the clip 1217 can be between approximately 0.1 mm and approximately 1.5 mm. In some examples, the second gap between the projections is approximately 0.75 mm. In some examples, the clip 1217 can comprise a single projection extending from the first portion 1203 or the second portion 1205. Alternatively, the first portion 1203 and second portion 1205 could be sufficiently close to each other to perform the clip function without the need for protrusions. Without any loss of generality, the one or more projections extending from the first portion 1203 and/or the second portion 1205 can also be referred to herein as retention features.

A user can wear the electronic device 1200 by inserting a portion of the user's clothing (e.g., a portion of the user's pants, a portion of the user's shirt), a portion of the user's accessory (e.g., a belt) or a portion of a lanyard disposed around the user's neck, shoulder, wrist or arm through the second gap between the projections extending from the first and second enclosures 1203 and 1205 that form the clip 1217. The clip 1217 can securely hold inserted portion of the user's clothing, accessory or lanyard, etc. such that the electronic device 1200 is held securely in place without slipping. As discussed in further detail below, the projections extending from the first and second portions 1203 and 1205 that form the clip 1217, the connecting region 1211, and/or parts of the first portion 1203 and the second portion 1205 can have sufficient elasticity to allow the electronic device 1200 to deflect over a portion of the user's clothing, a portion of the user's accessory or a portion of a lanyard, etc. For example, the projections extending from the first and second portions 1203 and 1205 that form the clip 1217 can be moved away from each other when the portion of the user's clothing, the portion of the user's accessory or the portion of a lanyard, etc. is being inserted through the second gap. The projections extending from the first and second portions 1203 and 1205 that form the clip 1217 can exert sufficient restorative force such that the electronic device 1200 can be securely attached to the portion of the user's clothing, the portion of the user's accessory or the portion of a lanyard, etc. that is pinched between the projections without slipping. The size of the second gap after the electronic device 1200 is attached to the portion of a user's clothing or accessory can be greater than or equal to the size of the second gap before the electronic device 1200 is attached to portion of a user's clothing or accessory. For example, in some examples the size of the second gap after the electronic device 1200 is attached to the portion of a user's clothing or accessory can be approximately 1%-10% greater than the size of the second gap before the electronic device 1200 is attached to the portion of a user's clothing or accessory. Without any loss of generality, the size of the second gap can be measured as a distance (e.g., a minimum distance) between the ends of the projections extending from the first portion 1203 and the second portion 1205.

In some examples, the projections extending from the first and second portion 1203 and 1205 that form the clip 1217 can be in contact with each other when the clip 1217 is not engaged with a portion of the user's clothing, a portion of the user's accessory and/or a portion of a lanyard disposed around a user's neck, wrist, arm, shoulder, etc. When the user is preparing to attach the electronic device 1200 to a portion of the user's clothing, a portion of the user's accessory and/or a portion of a lanyard disposed around a user's neck, wrist, arm, shoulder, etc., the first portion 1203 and the second portion 1205 can be moved apart to insert the portion of the user's clothing, the portion of the user's accessory and/or the portion of a lanyard disposed around a user's neck, wrist, arm, shoulder, etc.

As the user control interfaces are on the outside of the housing (e.g., on the outside periphery of the first portion 1203 and/or the second portion 1205), the user may accidently activate the one or more user control interfaces 1213 when preparing to wear the electronic device 1200 and/or in the process of wearing the electronic device 1200. Activation of the one or more user control interfaces 1213 when the electronic device 1200 is being put on (e.g., in the process of being attached to the portion of a user's clothing or accessory) or is about to be worn (e.g., grasped and picked up for wearing) is undesirable since one or more user control interfaces 1213 can inadvertently change the user's preferred settings when the wearable system 200 is being used. For example, the user may accidently activate the one or more user control interfaces 1213 thereby increasing the volume of the speaker when the electronic device 1200 is being put on. This may cause discomfort to the user when using the wearable system 200.

In some examples, the user control interfaces 1213 may be tied to device functions that require significant power resources to start up or to run. Thus, accidentally interacting with the user control interfaces 1213 can diminish battery life of the device. For example, if the user accidentally turns off the device then chooses to restart the device to continue their experience, battery power would be unnecessarily drained by the amount required to restart the device and restart programs or applications that the user was running. Power can also be unnecessarily drained from the battery if the user accidentally turns on a feature by interacting with the user control interfaces 1213. For example, if the user control interface 1213 is tied to a function such as image or video capture, a component with high power can begin operating and can reduce battery life of the device. Other components and scenarios of power drain on the device are possible depending on the functions assigned to the user control interfaces 1213.

Thus, it may be advantageous to temporarily disable the one or more user control interfaces 1213 when the electronic device 1200 is about to be worn (e.g., the electronic device 1200 is grasped and picked up by the user and positioned to be attached to the user's clothing/accessory or attached to a lanyard disposed around the user's neck, shoulder, arm or wrist, etc.) or is being put on or attached to the portion of a user's clothing or accessory (e.g., the electronic device 1200 is being inserted through a portion of the user's clothing/accessory or inserted through a portion of a lanyard disposed around the user's neck, shoulder, arm or wrist, etc.). The one or more user control interfaces 1213 can be reactivated once the user has attached the electronic device 1200 and/or begins operating the wearable system 200. Systems and methods of disabling the one or more one or more user control interfaces 1213 when the electronic device 1200 is grasped and picked up by the user for attaching to the portion of a user's clothing or accessory and/or is being attached to the portion of a user's clothing or accessory are discussed below.

The electronic device 1200 can comprise one or more inertial measurement units (IMUs) that can be used to detect the orientation of the electronic device 1200 and/or parameters associated with movement of the electronic device 1200 (e.g., speed, direction of movement, acceleration). The one or more IMUs can comprise gyroscopes, accelerometers or other motion sensors that can detect the orientation of the electronic device 1200 and/or parameters associated with movement of the electronic device 1200. The one or more IMUs can be disposed in the first portion 1203, the second portion 1205 of the electronic device 1200 or elsewhere in or on the electronic device 1200. An electronic control system disposed in the first portion 1203, the second portion 1205, or elsewhere in or on the electronic device 1200 can be configured to temporarily disable the one or more user control interfaces 1213 when the one or more IMUs detect that the electronic device 1200 is grasped and picked up for attaching to the portion of a user's clothing or accessory.

For example, the electronic device 1200 may be placed horizontally on a flat surface parallel to the ground (e.g., a table, a desk, or some other flat surface) when it is not worn by the user. When the user is preparing to wear the electronic device 1200, the user will grasp and pick up the electronic device 1200 from the flat surface parallel to the ground and orient at an angle to the flat surface. The angle can be greater than 30 degrees with respect to the flat surface, greater than or equal to about 60 degrees with respect to the flat surface or approximately 90 degrees with respect to the flat surface. The one or more IMUs can be configured to detect a change in the orientation of the electronic device 1200 as the electronic device 1200 is picked up from the flat surface and oriented at an angle with respect to the flat surface. The electronic control system can be configured to temporarily disable the one or more one or more user control interfaces 1213 in response to detecting a change in the orientation of the electronic device 1200 as the electronic device 1200 is picked up from the flat surface and oriented at an angle with respect to the flat surface.

As another example, the IMUs may be configured to detect motion of the electronic device 1200 along the x, y, and z axes. Without any loss of generality, the x-z plane can correspond to the horizontal plane parallel to the ground and the normal to the horizontal plane can be along the y-axis. Accordingly, the force of gravity can be directed along the y-axis. The one or more IMUs of the electronic device 1200 can be configured to detect acceleration along the y-axis. Acceleration along the y-axis greater than a threshold acceleration value can be indicative of the user picking up the electronic device 1200 from the flat surface and orienting the electronic device 1200 at an angle with respect to the flat surface for wearing. The electronic control system can be configured to temporarily disable the one or more one or more user control interfaces 1213 in response to detecting acceleration along the y-axis having a value greater than a threshold acceleration value. In some examples, the temporary disable can be based on the IMU detecting a motion pattern substantially similar to one or more patterns known from testing to be indicative of a user attaching the power pack clip to an object. Such an IMU motion map can include motion in three dimensions over a range of time.

Figure 13:
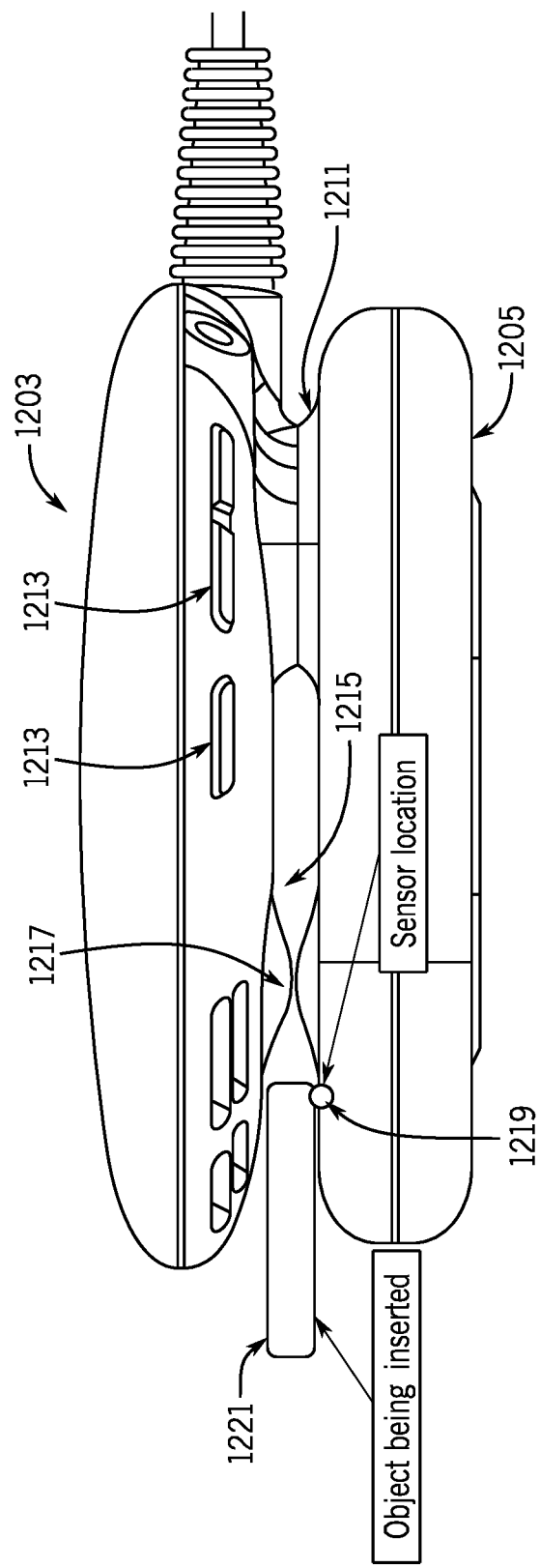
FIGS. 13 and 14 schematically illustrate a side view of the example of the wearable electronic device depicted in FIGS. 12A and 12B further comprising one or more sensors configured to detect that the electronic device is in the process of being attached to a portion of a user's clothing or accessory.
Figure 14:
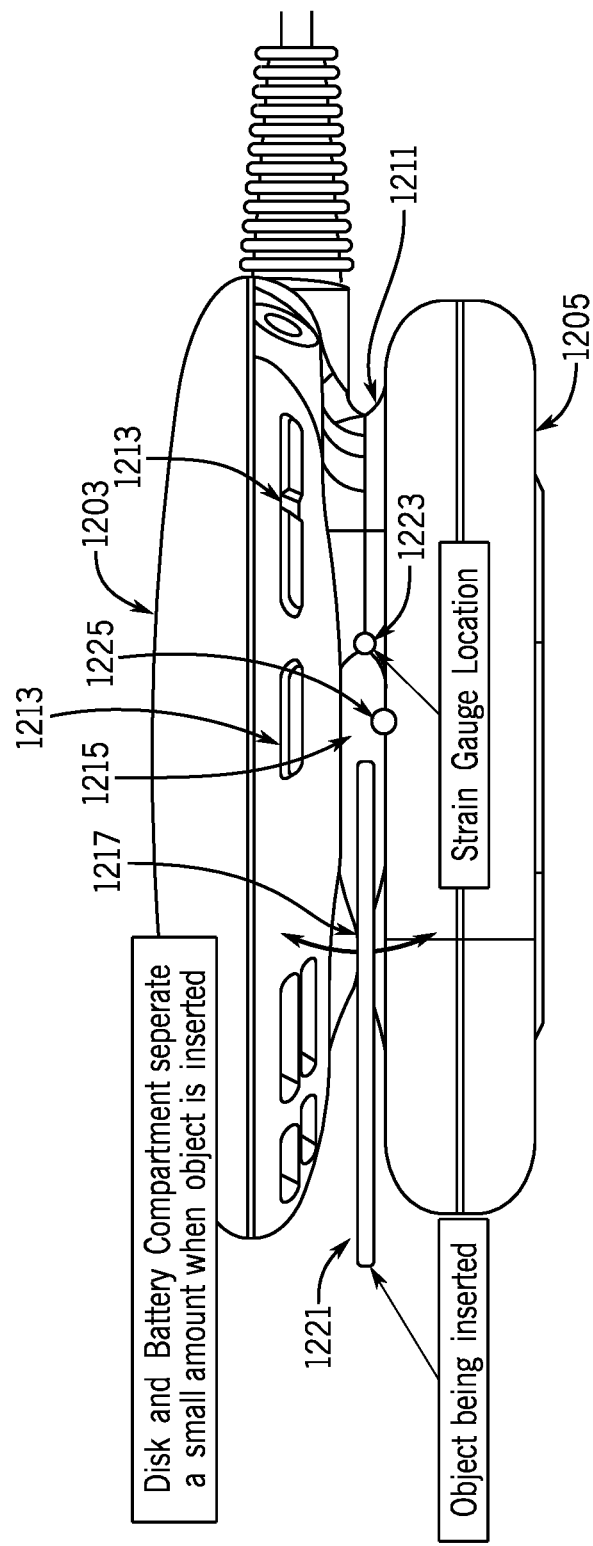

In various examples, the electronic control system can be configured to determine that the user has grasped and picked up the electronic device 1200 is for attaching to a portion of the user's clothing and/or accessory and/or that the user is in the process of attaching the electronic device 1200 to a portion of the user's clothing and/or accessory based on information provided by a sensor 1219 and/or 1223 depicted in FIGS. 13 and 14. For example, various examples of the electronic device 1200 can comprise a sensor 1219 disposed in the gap 1215 between first portion 1203 and the second portion 1205 to detect that the electronic device 1200 is in the process of being attached to a portion of the user's clothing and/or accessory as shown in FIG. 13. The sensor 1219 can be positioned between the beginning of the gap 1215 and the clip 1217 as shown in FIG. 13 such that the portion of the user's clothing or accessory passes over the sensor 1219 before passing through the second gap of the clip 1217. The sensor 1219 can be configured to sense that an object 1221 (e.g., a portion of the user's clothing, a portion of the user's accessory or a portion of a lanyard disposed around the user's neck, shoulder, arm or wrist, etc.) is being inserted in the gap 1215.

For example, in some examples, the sensor 1219 can comprise a proximity sensor that is able to detect presence of objects in its vicinity. A proximity sensor may, for example, comprise an IR light emitter that emits light in the area surrounding the proximity sensor and an IR detector configured to detect light reflected from objects in the in the area surrounding the proximity sensor. When the electronic device 1200 is in the process of being attached to the user's clothing or accessory, the portion of the user's clothing, the portion of the user's accessory or the portion of a lanyard disposed around the user's neck, shoulder, arm or wrist that is inserted in the gap 1215 would reflect IR light emitted by the light emitter of the proximity sensor. The IR detector would detect the reflected IR light. If the signal from the IR detector is above a threshold value, then it can be an indication that an object 1221 (e.g., a portion of the user's clothing, a portion of the user's accessory or a portion of a lanyard disposed around the user's neck, shoulder, arm or wrist, etc.) is being inserted in the gap 1215.

As another example, in some examples, the sensor 1219 can comprise a light sensor that is able to detect changes in the amount of light in the gap 1215. When the electronic device 1200 is in the process of being attached to the user's clothing or accessory, the portion of the user's clothing, the portion of the user's accessory or the portion of a lanyard disposed around the user's neck, shoulder, arm or wrist, etc. that is inserted in the gap 1215 obstruct (cover or block) the light sensor. The light sensor would then detect a reduction in the intensity of light in the gap 1215. Accordingly, if the light sensor detects that the intensity of light in the gap 1215 is below a threshold value, then it can be an indication that an object 1221 (e.g., a portion of the user's clothing, a portion of the user's accessory or a portion of a lanyard disposed around the user's neck, shoulder, arm or wrist, etc.) is being inserted in the gap 1215.

In various examples, the sensor 1219 can comprise a light emitter (e.g., an IR light emitter) disposed on the first portion 1203 or the second portion 1205 and a light detector (e.g., an IR light sensor) disposed opposite to the light emitter. When the electronic device 1200 is in the process of being attached to a portion of the user's clothing or accessory, light emitted from the light emitter will be blocked by the portion of the user's clothing, the portion of the user's accessory or the portion of a lanyard disposed around the user's neck, shoulder, arm or wrist, etc. that is inserted in the gap 1215 and the light sensor disposed opposite to the light emitter would detect a reduction in the intensity of light or a loss of light. Accordingly, if the light sensor detects that the intensity of received light is below a threshold value, then it can be an indication that an object 1221 (e.g., a portion of the user's clothing, a portion of the user's accessory or a portion of a lanyard disposed around the user's neck, shoulder, arm or wrist, etc.) is being inserted in the gap 1215.

It is noted that after the electronic device 1200 is attached to a portion of the user's clothing or accessory, the sensor 1219 would continue to detect either an increase in reflected light indicating presence of an object in the vicinity of the sensor 1219 and/or a reduction in the intensity indicating obstructing by an object. This may result in the one or more user control interface 1213 to be inadvertently disabled when the electronic device 1200 is attached to the portion of the user's clothing or accessory and is being used. Thus, the electronic control system can be configured to disable the one or more user interfaces 1213 in response to a change in the amount of light received by the sensor over a time interval.

For example, the electronic control system can be configured to disable the one or more user interfaces 1213 in response to an increase in the amount of reflected light detected by the sensor 1219 comprising a proximity sensor at a time t2 compared to a previous time t1. The time interval (t2-t1) can be in the order of a few microseconds or a few milliseconds, such as for example, between about 1 microsecond and about 10 microseconds, between about 5 microseconds and about 20 microseconds, between about 10 microseconds and about 50 microseconds, between about 30 microseconds and about 100 microseconds, between about 100 microseconds and about 500 microseconds, between about 300 microseconds and about 700 microseconds, between about 500 microseconds and about 1 millisecond, between about 1 millisecond and about 5 milliseconds, between about 10 milliseconds and about 100 milliseconds, or in any range/sub-range defined by any of these values.

As another example, the electronic control system can be configured to disable the one or more user interfaces 1213 in response to a decrease in the amount of reflected light detected by the sensor 1219 comprising a light sensor at a time t2 compared to a previous time t1. The time interval (t2-t1) can be in the order of a few microseconds or a few milliseconds, such as for example, between about 1 microsecond and about 10 microseconds, between about 5 microseconds and about 20 microseconds, between about 10 microseconds and about 50 microseconds, between about 30 microseconds and about 100 microseconds, between about 100 microseconds and about 500 microseconds, between about 300 microseconds and about 700 microseconds, between about 500 microseconds and about 1 millisecond, between about 1 millisecond and about 5 milliseconds, between about 10 milliseconds and about 100 milliseconds, or in any range/sub-range defined by any of these values.

In various examples, the sensor 1219 can comprise both a proximity sensor and a light sensor. The position of the sensor 1219 is selected to reduce the chance of an incorrect indication that an object (e.g., a portion of the user's clothing, a portion of the user's accessory or a portion of a lanyard disposed around the user's neck, shoulder, arm or wrist, etc.) is being inserted in the gap 1215. For example, consider that the sensor 1219 comprising a light sensor is disposed in the periphery of the first portion 1203 or the second portion 1205 and a person wearing the electronic device 1200 moves from a bright environment to a dark environment or the user places the electronic device 1200 in a bag or a purse for storage. The light sensor would detect that the ambient light is below a threshold and, it may be incorrectly determined that an object (e.g., a portion of the user's clothing, a portion of the user's accessory or a portion of a lanyard disposed around the user's neck, shoulder, arm or wrist, etc.) is being inserted in the gap 1215. Accordingly, in various examples, the sensor 1219 can be placed within the gap 1215 and close to the clip 1217 as discussed above to increase the accuracy of the determination that an object (e.g., a portion of the user's clothing, a portion of the user's accessory or a portion of a lanyard disposed around the user's neck, shoulder, arm or wrist, etc.) is being inserted in the gap 1215. In such examples having two sensors, the likelihood of inaccurately detecting an object being inserted into the gap 1215 may be reduced because of the redundancy. For example, both sensors can provide an indication to the electronic control system that an object being inserted into the gap 1215 is detected before the one or more user control interfaces 1213 are disabled as discussed below.

Consider, for example, that the electronic control system determines based on the information provided by the one or more IMUs that the user has grasped and picked up the electronic device 1200. In a first scenario the user may proceed to attach the electronic device 1200 to a portion of the user's clothing or accessory. In this first scenario, the proximity sensor can detect presence of an object in the gap 1215 and the light sensor may detect reduction or loss of light in the gap 1215. Based on the information provided by the proximity sensor and the light sensor, the electronic control system can determine that the electronic device 1200 is in the process of being attached to a portion of the user's clothing or accessory and disable the one or more user control interfaces 1213. In a second scenario, the user may proceed to place the electronic device 1200 in a pocket or a purse. In this second scenario, while the light sensor may detect reduction or loss of light in the gap 1215, the proximity sensor does not detect presence of an object in the gap 1215. In the second scenario, the electronic control system can determine that the electronic device 1200 is not in the process of being attached to a portion of the user's clothing or accessory and thus may not disable the one or more user control interfaces 1213. In this manner, the electronic control system can determine with greater accuracy that the electronic device 1200 is in the process of being attached to a portion of the user's clothing or accessory.

In various examples, the electronic control system can be configured to determine that the electronic device 1200 is in the process of being attached to a portion of the user's clothing or accessory based on information provided by a sensor 1223 shown in FIG. 14. The sensor 1223 can be configured to determine a change in distance of the second gap between the pair of projections of the clip 1217 that extend from the first portion 1203 and the second portion 1205 which can provide an indication that the electronic device 1200 is being put on. The sensor 1223 can be disposed in the connecting region 1211 as shown in FIG. 14.

In various examples, the sensor 1223 can comprise a strain gauge that is configured to measure the strain in the connecting region 1211 as the projections of the clip 1217 are moved away from each other. Without any loss of generality, the strain gauge can comprise a deformable conductive element (e.g., a conductive foil). The electrical resistance of the deformable conductive element can vary based on the amount of deformation of the conductive element. Accordingly, measuring a change in the electrical resistance of the deformable conductive element can be correlated to the amount of strain.

In various examples, the sensor 1223 can comprise a Hall effect sensor. Without subscribing to any particular theory, the Hall effect sensor is configured to output an electrical voltage that varies in response to a variation in a magnetic field. The Hall effect sensor can be configured for proximity detection, positioning, speed detection and current sensing application. In various designs of the electronic device 1200 comprising a Hall effect sensor, the Hall effect sensor can be disposed in the projection extending from the first portion 1203 or the projection extending from the second portion 1205 and a magnet can be disposed on the opposite end (e.g., projection extending from the second portion 1205 or the projection extending from the first portion 1203 respectively). As the electronic device 1200 is in the process of being attached to a portion of the user's clothing or accessory, the projections of the clip 1217 will move away from each other which will cause a change in the magnetic field strength. The Hall effect sensor can be configured to detect the change in the magnetic field strength as the projections of the clip 1217 move away from each other when the electronic device 1200 is being put on in comparison with the magnetic field strength when the electronic device is not being put on.

The electronic control system can be configured to temporarily disable the one or more user interfaces 1213 in response to the sensor 1223 comprising a strain gauge and/or a Hall effect sensor providing an indication that the distance of the second gap of the clip 1217 is increased.

It is noted that after the electronic device 1200 is attached to a portion of the user's clothing or accessory, the sensor 1223 may continue to detect either a change in the amount of strain or a change in the magnetic field strength indicating that the clip 1217 is open. This may result in the one or more user control interface 1213 to be inadvertantly disabled when the electronic device 1200 is attached to the portion of the user's clothing or accessory and is being used. Thus, the electronic control system can be configured to disable the one or more user interfaces 1213 in response to a change in the amount of strain or a change in the magnetic field strength over a time interval.

For example, the electronic control system can be configured to disable the one or more user interfaces 1213 in response to change in the strain detected by the sensor 1223 comprising a strain gauge at a time t2 compared to a previous time t1. The time interval (t2-t1) can be in the order of a few microseconds or a few milliseconds, such as for example, between about 1 microsecond and about 10 microseconds, between about 5 microseconds and about 20 microseconds, between about 10 microseconds and about 50 microseconds, between about 30 microseconds and about 100 microseconds, between about 100 microseconds and about 500 microseconds, between about 300 microseconds and about 700 microseconds, between about 500 microseconds and about 1 millisecond, between about 1 millisecond and about 5 milliseconds, between about 10 milliseconds and about 100 milliseconds, or in any range/sub-range defined by any of these values.

As another example, the electronic control system can be configured to disable the one or more user interfaces 1213 in response to a change in the magnetic field strength detected by the sensor 1223 comprising a Hall effect sensor at a time t2 compared to a previous time t1. The time interval (t2-t1) can be in the order of a few microseconds or a few milliseconds, such as for example, between about 1 microsecond and about 10 microseconds, between about 5 microseconds and about 20 microseconds, between about 10 microseconds and about 50 microseconds, between about 30 microseconds and about 100 microseconds, between about 100 microseconds and about 500 microseconds, between about 300 microseconds and about 700 microseconds, between about 500 microseconds and about 1 millisecond, between about 1 millisecond and about 5 milliseconds, between about 10 milliseconds and about 100 milliseconds, or in any range/sub-range defined by any of these values.

In various examples, the one or more user control interfaces 1213 can comprise capacitive sensors that are configured to detect a touch input from the user. The capacitive sensors can be configured to detect contact between the user's skin and the one or more user control interfaces 1213. The capacitive sensors can be used independently or in combination with the IMUs, sensor 1219 and/or sensor 1223 to temporarily disable the one or more user control interfaces 1213 when the electronic device 1200 is grasped and picked up by the user.

For example, if the one or more capacitive sensors sense contact between the user's skin and the one or more user control interfaces 1213 and the IMUs detect a change in orientation, acceleration and/or movement of the electronic device 1200, then a determination can be made that the user has picked up the electronic device 1200 and is preparing to wear the electronic device 1200. Accordingly, the one or more user control interfaces 1213 can be temporarily disabled to prevent accidental activation of the one or more user control interfaces 1213.

As another example, if the one or more capacitive sensors sense contact between the user's skin and the one or more user control interfaces 1213 and the sensors 1219 and/or 1223 detect that the electronic device 1200 is in the process of being attached to a portion of the user's clothing or accessory, then a determination can be made that the user is putting on the electronic device 1200. Accordingly, the one or more user control interfaces 1213 can be temporarily disabled to prevent accidental activation of the one or more user control interfaces 1213.

Figure 15:
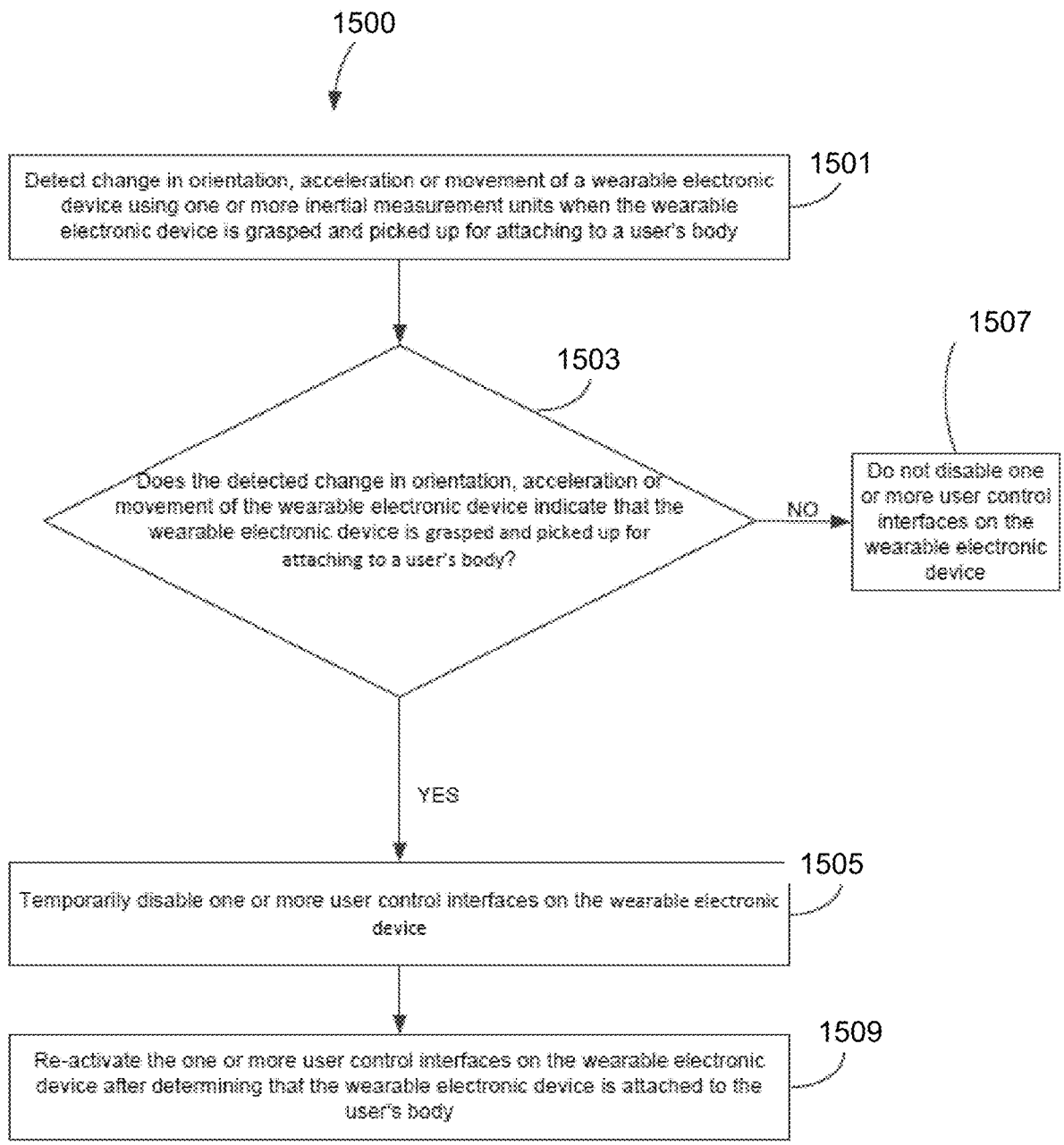
FIG. 15 is a flowchart depicting an example of a method of temporarily disabling one or more user control interfaces when the example of the electronic device depicted in FIGS. 12A and 12B is picked up for attaching to a portion of a user's clothing or accessory.

FIG. 15 is a flowchart depicting an example 1500 of a method of temporarily disabling one or more user control interfaces 1213 when the electronic device 1200 is about to be worn. As discussed herein, one or more IMUs associated with the electronic device 1200 can be configured to detect a change in orientation (e.g., from horizontal to an angle greater than about 30 degrees with respect to horizontal), acceleration or movement of the electronic device 1200 as shown in block 1501. A determination of whether the change in the orientation, acceleration or movement indicates that the electronic device 1200 is being grasped and picked up for wearing is made in block 1503. For example, if the IMUs detect an acceleration greater than a threshold acceleration value along the vertical direction corresponding to the direction of gravitational force, then a determination that the electronic device 1200 is grasped and picked up for wearing can be made. In response to determining that the change in the orientation, acceleration or movement of the electronic device 1200 indicates that the electronic device 1200 is being grasped and picked up for wearing, one or more user control interfaces 1213 can be temporarily disabled as shown in block 1505. If the change in the orientation, acceleration or movement of the electronic device 1200 does not indicate that that the electronic device 1200 is being grasped and picked up for wearing, then the one or more user control interfaces 1213 are not disabled as shown in block 1507.

The electronic control system is configured to reactivate the one or more user control interfaces 1213 once the electronic device 1200 is attached to a portion of the user's clothing or accessory as shown in block 1509. For example, the one or more user control interfaces 1213 can be reactivated after a certain interval of time (e.g., greater than or equal to 5 seconds, greater than or equal to 10 seconds, greater than or equal to 30 seconds, greater than or equal to 45 seconds and/or less than or equal to 60 seconds, or any range/sub-range defined by any of these values) has elapsed. The time interval after which the one or more user control interfaces 1213 are reactivated can be sufficiently long to ensure that the electronic device 1200 is attached to a portion of the user's clothing or accessory. In some examples, the one or more user control interfaces 1213 can be reactivated if no change in the orientation, acceleration or movement of the electronic device 1200 is detected by the IMUs for a period of time. In some examples, the one or more user control interfaces 1213 can be reactivated if a change in the acceleration along the vertical direction falls below the threshold acceleration value.

Figure 16:
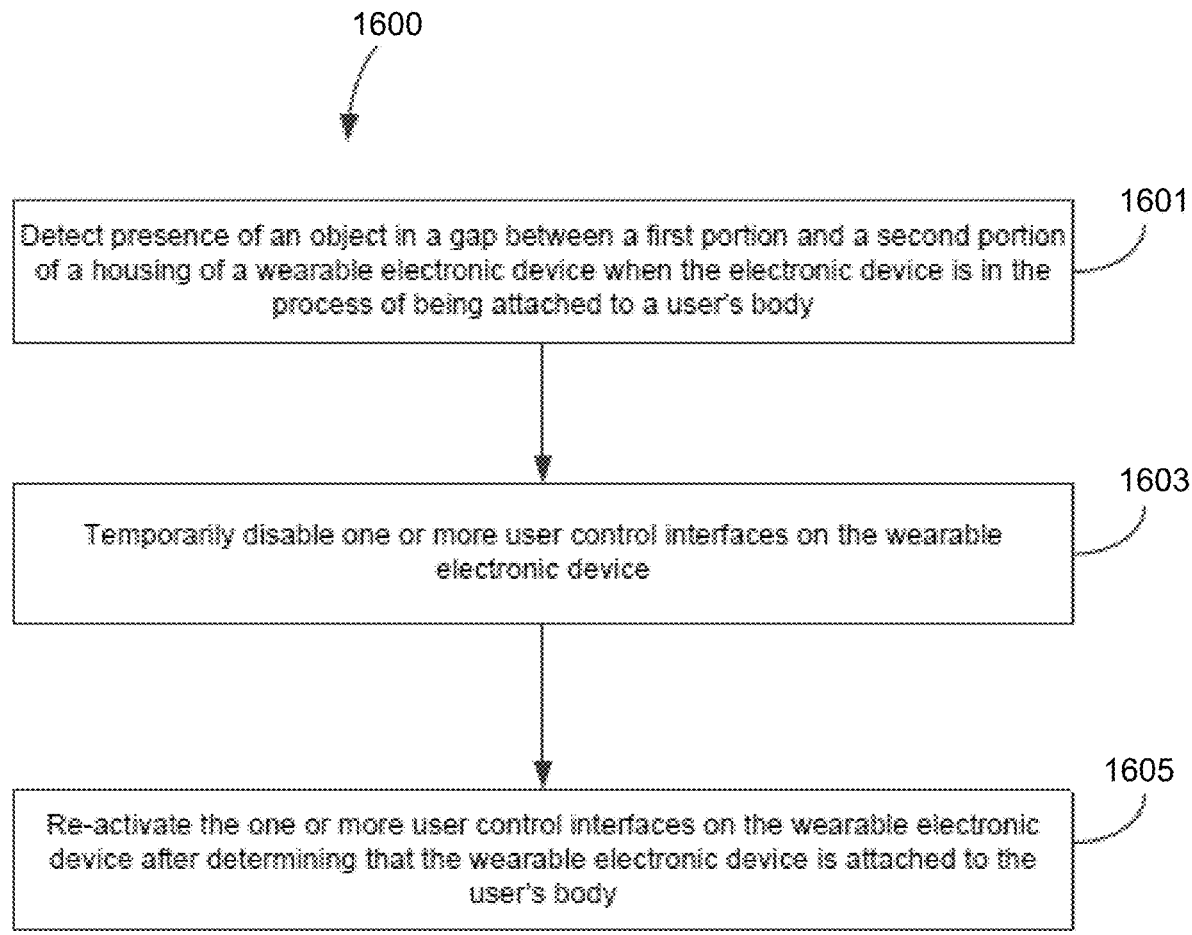
FIG. 16 is a flowchart depicting an example of a method of temporarily disabling one or more user control interfaces when the example of the electronic device depicted in FIGS. 12A and 12B is in the process of being attached (or put on) to a portion of a user's clothing or accessory.

FIG. 16 is a flowchart depicting an example 1600 of a method of temporarily disabling one or more user control interfaces 1213 when the electronic device 1200 is in the process of being attached to a portion of a user's clothing or accessory. As discussed herein, one or more sensors (e.g., sensors 1219 and/or 1223) can be configured to detect when the electronic device 1200 is in the process of being attached to a portion of a user's clothing or accessory as shown in block 1601. In response to determining that the electronic device 1200 is in the process of being attached to a portion of a user's clothing or accessory, one or more user control interfaces 1213 can be temporarily disabled as shown in block 1603.

The electronic control system is configured to reactivate the one or more user control interfaces 1213 once the electronic device 1200 is attached to a portion of a user's clothing or accessory as shown in block 1605. For example, the one or more user control interfaces 1213 can be reactivated after a certain interval of time (e.g., greater than or equal to 5 seconds, greater than or equal to 10 seconds, greater than or equal to 30 seconds, greater than or equal to 45 seconds and/or less than or equal to 60 seconds, or any range/sub-range defined by these values) has elapsed. The time interval after which the one or more user control interfaces 1213 are reactivated can be sufficiently long to ensure that the electronic device 1200 is attached to a portion of a user's clothing or accessory. In some examples, the one or more user control interfaces 1213 can be reactivated if the output of the sensor 1223 has stabilized to final value which can be an indication that the second gap of the clip 1217 has reached its final value indicating that the electronic device 1200 is attached to a portion of a user's clothing or accessory. In various examples, the one or more user control interfaces 1213 can be reactivated if the output of the sensor 1219 and/or the sensor 1223 remains within 1%-10% of a nominal value over a certain period of time.

As discussed herein, in certain implementations, the one or more user control interfaces 1213 can be reactivated when an output of the sensor 1219 (e.g., proximity sensor and/or light sensor), the sensor 1223 (e.g., strain gauge, electromagnetic sensor, Hall effect sensor) and/or one or more IMUs reaches a steady state or a stable value, which can be an indication that the process of attaching the electronic device 1200 to a portion of a user's clothing or accessory is complete. Some examples of the electronic device 1200 can be additionally or alternatively be configured to reactivate the one or more user control interfaces 1213 after a certain period of time has elapsed after the one or more user control interfaces 1213 have been disabled. In such examples, for example, an electronic timer or an electronic timing circuit can be used. Based on timing information provided by such timing electronics, the one or more user control interface 1213 can be disabled for a pre-determined time (e.g., greater than or equal to 5 seconds, greater than or equal to 10 seconds, greater than or equal to 30 seconds, greater than or equal to 45 seconds and/or less than or equal to 60 seconds, or any range/sub-range defined by any of these values) after the electronic control system determines that the electronic device 1200 is in the process of being attached to a portion of a user's clothing or accessory. Additionally and/or alternatively, the based on timing information provided by such timing electronics, the one or more user control interface 1213 can be reactivated after the pre-determined time (e.g., greater than or equal to 5 seconds, greater than or equal to 10 seconds, greater than or equal to 30 seconds, greater than or equal to 45 seconds and/or less than or equal to 60 seconds, or any range/sub-range defined by any of these values) has elapsed.

Additionally, or alternatively, some examples of the electronic device 1200 can comprise a sensor 1225 (e.g., a proximity sensor and/or a light sensor) that is disposed between the clip 1217 and the connection region 1211 as shown in FIG. 14. In some examples, the sensor 1225 can be disposed in the connecting region 1211. The sensor 1225 can be configured to determine the presence of the object 1221 in the portion of the gap 1215 between the clip 1217 and the connection region 1211. The sensor 1225 can advantageously confirm that the object 1221 has been completely or almost completely inserted into the gap 1215 and that the user has finished or almost finished attaching the electronic device 1200 to a portion of the user's clothing/accessory. The one or more user control interfaces 1213 can be reactivated within a certain time interval (e.g., less than or equal to 1 millisecond, less than or equal to 5 milliseconds, less than or equal to 10 milliseconds, less than or equal to 20 milliseconds, or any range/sub-range defined by any of these values) of the detection of the object 1221 by the sensor 1225. In this manner, the risk of accidental actuation of the one or more user control interfaces 1213 can be reduced and functionality provided by the one or more user control interfaces 1213 can be reactivated.

The electronic processor and/or the electronic control system associated with the electronic device 1200 can be configured to execute instructions stored on a non-transitory storage device to carry out the method 1500 and the method 1600.

In various examples, the electronic processor and/or the electronic control system associated with the electronic device 1200 can be configured to execute instructions stored on a non-transitory storage device to temporarily disable the one or more user control interfaces 1213 if the sensor 1219 (e.g., light sensor and/or a proximity sensor) detects that the electronic device 1200 is in the process of being attached to a portion of a user's clothing or accessory. In some examples, the sensor 1219 comprising only a light sensor can incorrectly determine that the user is wearing the electronic device 1200 when the user moves to a dark environment. Accordingly, the electronic processor and/or the electronic control system associated with the electronic device 1200 can be configured to receive and analyze input from another sensor (e.g., a proximity sensor, one or more IMUs) before making a determination to temporarily disable the one or more user control interfaces 1213. In various examples, the electronic processor and/or the electronic control system associated with the electronic device 1200 can be configured to execute instructions stored on a non-transitory storage device to provide a visual indication on the display 220 of the wearable system 200 if the sensor 1219 (e.g., light sensor and/or a proximity sensor) detects an object near the clip 1217 and/or the capacitive sensors of the one or more user control interfaces 1213 detect contact with the user's skin. The visual indication may be a warning that the one or more user control interfaces 1213 are being temporarily disabled or authorization to temporarily disable the one or more user control interfaces 1213.

OTHER CONSIDERATIONS

Each of the processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, animations or video may include many frames, with each frame having millions of pixels, and specifically programmed computer hardware is necessary to process the video data to provide a desired image processing task or application in a commercially reasonable amount of time.

Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed processes or process steps may be stored, persistently or otherwise, in any type of non-transitory, tangible computer storage or may be communicated via a computer-readable transmission medium.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some examples, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed examples. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure. Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. No single feature or group of features is necessary or indispensable to each and every example.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain examples require at least one of X, at least one of Y and at least one of Z to each be present.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A head-mounted display system configured to project light to an eye of a user to display augmented reality image content in a vision field of said user, said head-mounted display system comprising:

a frame configured to be supported on a head of a user;

a display coupled to the frame, said display configured to project light into said user's eye to display augmented reality image content to the user's vision field; and an electronic device configured to be attached to a portion of a user's clothing or accessory, the electronic device being remote from the frame, the electronic device comprising:

a housing comprising a first portion and a second portion separated from the first portion by a first gap, the first portion comprising a first projection extending into the first gap and being separated from the second portion by a second gap, said housing further comprising a connecting region joining the first portion and the second portion, the electronic device being configured to be attached to a portion of the user's clothing or accessory by inserting a portion of the user's clothing or accessory through the second gap between the first projection and the second portion;

an electrical power supply supported by the housing and configured to provide power to the display;

one or more user control interfaces disposed on the housing, the one or more user control interfaces configured to control a parameter of the head-mounted display system; and a strain gauge disposed in or near the connecting region, the strain gauge configured to detect a change in strain of the connecting region caused by a change in a size of the second gap,
wherein an electronic control system of the electronic device is configured to temporarily disable the one or more user control interfaces in response to the strain gauge detecting a strain in the connecting region.

2. The head mounted display system of claim 1, wherein the parameter comprises at least one of volume, brightness, contrast or color.

3. The head-mounted display system of claim 1, wherein the first portion comprises one or more electronic components and the second portion comprises an electrical power supply system.

4. The head-mounted display system of claim 1, further comprising a proximity sensor disposed in the first gap, the proximity sensor configured to detect presence of an object in the first gap.

5. The head-mounted display system of claim 4, wherein the proximity sensor comprises an infrared (IR) light emitter configured to emit IR light and an IR sensor configured to detect IR light reflected from the object in the first gap.

6. The head-mounted display system of claim 4, wherein the electronic control system is configured to temporarily disable the one or more user control interfaces in response to the proximity sensor detecting the presence of the object in the first gap.

7. The head-mounted display system of claim 1, further comprising a magnetic sensor disposed in the first or second portion and a magnet disposed in the second or first portion.

8. The head-mounted display system of claim 7, wherein the electronic control system is configured to temporarily disable the one or more user control interfaces in response to the magnetic sensor detecting a change in magnetic field strength caused by a change in the size of the second gap as the electronic device is in the process of being attached to a portion of the user's clothing or accessory.

9. The head-mounted display system of claim 1, further comprising a light sensor disposed in the first gap, the light sensor configured to detect an amount of light in the first gap.

10. The head-mounted display system of claim 9, wherein the electronic control system is configured to temporarily disable the one or more user control interfaces in response to the light sensor detecting that the amount of light in the first gap is below a threshold level.

11. The head-mounted display system of claim 1, further comprising one or more inertial measurement units configured to detect a change in orientation, an acceleration or a movement of the electronic device.

12. The head-mounted display system of claim 11, wherein the electronic control system is configured to temporarily disable the one or more user control interfaces in response to the one or more inertial measurement units detecting that the change in the orientation, acceleration or movement of the electronic device indicates that the electronic device is grasped and picked up by the user for attaching to a portion of the user's clothing or accessory.

13. The head-mounted display system of claim 1, wherein the electronic device comprises a sensor configured to provide information based on which the electronic control system can determine either (a) that the electronic device has been attached to the portion of the user's clothing or accessory or (b) or that the electronic device has almost been attached to the portion of the user's clothing or accessory, or (c) both (a) and (b), and wherein the electronic control system can activate the one or more user control interfaces.

14. The head mounted display system of claim 1, wherein the electronic control system is configured to activate the one or more user control interfaces in response to detecting that the electronic device is attached to a portion of the user's clothing or accessory.

15. The head-mounted display system of claim 1, wherein the housing is connected to the frame by a wire.

16. The head-mounted display system of claim 1, further comprising an input device including an input device housing separate from the housing, the input device comprising an additional one or more user control interfaces supported by the input device housing and configured to control an additional parameter of the head-mounted display system, the additional parameter including a parameter of a virtual user interface provided by the display.

17. The head-mounted display system of claim 1, further comprising a second projection extending from the second portion into the first gap, the first projection and the second projection being separated by the second gap.

18. The head-mounted display system of claim 17, wherein the first projection and the second projection form a clip.

19. A method of disabling one or more user control interfaces disposed on a wearable electronic device when the wearable electronic device is in the process of being attached to a portion of a user's clothing or accessory, the wearable electronic device comprising a housing comprising a first portion and a second portion separated from the first portion by a first gap, the first portion comprising a projection extending into the first gap and being separated from the second portion by a second gap, said housing further comprising a connecting region joining the first portion and the second portion, the wearable electronic device being configured to be attached to a portion of the user's clothing or accessory by inserting a portion of the user's clothing or accessory through the second gap between the projection and the second portion, the method comprising:
by the wearable electronic device, providing power to a display of a head-mounted system;
detecting a change in strain of the connecting region with a strain gauge disposed in or near the connecting region, the change in strain caused by a change in a size of the second gap;
determining, using an electronic processor, that the change in strain of the connecting region indicates that the wearable electronic device is in the process of being attached to a portion of the user's clothing or accessory; and
temporarily disabling the one or more user control interfaces using an electronic control system in response to determining that the wearable electronic device is in the process of being attached to a portion of the user's clothing or accessory.

20. The method of claim 19, further comprising activating the one or more user control interfaces in response to determining that the wearable electronic device is attached to a portion of the user's clothing or accessory.

* * * * *